(12) United States Patent
Lin et al.

(10) Patent No.: US 12,211,862 B2
(45) Date of Patent: Jan. 28, 2025

(54) MULTI-PROTRUSION TRANSFER GATE MANUFACTURING METHOD

(71) Applicant: TAIWAN SEMICONDUCTOR MANUFACTURING COMPANY, LTD., Hsinchu (TW)

(72) Inventors: Kun-Huei Lin, Hsinchu (TW);
Yun-Wei Cheng, Hsinchu (TW);
Chun-Hao Chou, Hsinchu (TW);
Kuo-Cheng Lee, Hsinchu (TW);
Chun-Wei Chia, Hsinchu (TW)

(73) Assignee: TAIWAN SEMICONDUCTOR MANUFACTURING COMPANY, LTD, Hsinchu (TW)

( * ) Notice: Subject to any disclaimer, the term of this patent is extended or adjusted under 35 U.S.C. 154(b) by 0 days.

(21) Appl. No.: 18/054,674

(22) Filed: Nov. 11, 2022

(65) Prior Publication Data
US 2023/0078927 A1    Mar. 16, 2023

Related U.S. Application Data

(63) Continuation of application No. 16/850,524, filed on Apr. 16, 2020, now Pat. No. 11,521,997.

(51) Int. Cl.
*H01L 27/146*    (2006.01)
*G01R 29/08*    (2006.01)
(Continued)

(52) U.S. Cl.
CPC ........ *H01L 27/14614* (2013.01); *G01R 29/08* (2013.01); *H01L 27/0203* (2013.01);
(Continued)

(58) Field of Classification Search
None
See application file for complete search history.

(56) References Cited

U.S. PATENT DOCUMENTS 6,033,959 A    3/2000   Fu
6,853,031 B2   2/2005   Liao et al.
(Continued)

FOREIGN PATENT DOCUMENTS

CN    107980178         5/2018
JP    2018190797 A  *  11/2018  ........... H01L 27/146
(Continued)

OTHER PUBLICATIONS

Office Acton dated Nov. 10, 2021 from corresponding application No. KR 10-2020-0083614 (pp. 1-5).
(Continued)

*Primary Examiner* — Scott B Geyer
(74) *Attorney, Agent, or Firm* — Hauptman Ham, LLP

(57) ABSTRACT

A method of manufacturing a transistor structure includes forming a plurality of trenches in a substrate, lining the plurality of trenches with a dielectric material, forming first and second substrate regions at opposite sides of the plurality of trenches, and filling the plurality of trenches with a conductive material. The plurality of trenches includes first and second trenches aligned between the first and second substrate regions, and filling the plurality of trenches with the conductive material includes the conductive material extending continuously between the first and second trenches.

20 Claims, 11 Drawing Sheets

(51) Int. Cl.
  *H01L 27/02* (2006.01)
  *H01L 29/423* (2006.01)
  *H04N 25/00* (2023.01)

(52) U.S. Cl.
  CPC .. *H01L 27/14603* (2013.01); *H01L 27/14612* (2013.01); *H01L 27/14636* (2013.01); *H01L 27/14643* (2013.01); *H01L 29/4236* (2013.01); H01L 27/14605 (2013.01); H01L 2924/13081 (2013.01); H04N 25/00 (2023.01)

(56) References Cited

U.S. PATENT DOCUMENTS

| | | | |
|---|---|---|---|
| 7,242,430 B2 | 7/2007 | Yaung et al. | |
| 7,391,068 B2 | 6/2008 | Kito et al. | |
| 8,310,004 B2 | 11/2012 | Kawaguchi | |
| 8,319,279 B2 | 11/2012 | Kawaguchi | |
| 8,552,492 B2 | 10/2013 | Sanda et al. | |
| 9,659,987 B2 | 5/2017 | Wang et al. | |
| 9,818,788 B2 | 11/2017 | Sze et al. | |
| 9,843,754 B1 | 12/2017 | Yi | |
| 9,893,107 B2 | 2/2018 | Wei et al. | |
| 10,304,886 B2 | 5/2019 | Chiang et al. | |
| 10,741,593 B1 | 8/2020 | Mabuchi et al. | |
| 2002/0003256 A1* | 1/2002 | Maegawa | H01L 29/42384 257/E29.13 |
| 2002/0003257 A1 | 1/2002 | Fu | |
| 2004/0021787 A1 | 2/2004 | Cho | |
| 2006/0081887 A1 | 4/2006 | Lyu | |
| 2006/0084195 A1* | 4/2006 | Lyu | H01L 27/14603 257/E27.131 |
| 2006/0255412 A1 | 11/2006 | Ramaswamy et al. | |
| 2008/0203483 A1 | 8/2008 | Kuroki | |
| 2009/0140374 A1 | 6/2009 | Choi | |
| 2010/0327345 A1* | 12/2010 | Kawaguchi | H01L 29/66621 257/330 |
| 2013/0341692 A1 | 12/2013 | Tseng et al. | |
| 2014/0252420 A1 | 9/2014 | Yi et al. | |
| 2014/0264719 A1 | 9/2014 | Chou et al. | |
| 2015/0372034 A1 | 12/2015 | Chen et al. | |
| 2017/0110494 A1 | 4/2017 | Tsai et al. | |
| 2018/0166481 A1* | 6/2018 | Wei | H01L 27/14614 |
| 2018/0182795 A1* | 6/2018 | Kim | H01L 29/78 |
| 2019/0067343 A1 | 2/2019 | Chen et al. | |
| 2019/0103428 A1 | 4/2019 | Wei et al. | |
| 2019/0123079 A1* | 4/2019 | Kudoh | H01L 29/4236 |
| 2021/0210534 A1 | 7/2021 | Chen et al. | |
| 2021/0305297 A1 | 9/2021 | Tian et al. | |
| 2021/0305298 A1 | 9/2021 | Hu et al. | |

FOREIGN PATENT DOCUMENTS

| | | |
|---|---|---|
| KR | 20060034926 | 4/2006 |
| TW | 558841 | 10/2003 |
| TW | 201003907 | 1/2010 |
| TW | 201027733 | 7/2010 |
| TW | 201143073 | 12/2011 |
| TW | 201620125 | 6/2016 |
| TW | 201630173 | 8/2016 |
| TW | 201703238 | 1/2017 |
| TW | 201911591 | 3/2019 |
| TW | 201929917 | 8/2019 |
| TW | 201933616 | 8/2019 |
| TW | 202013726 | 4/2020 |

OTHER PUBLICATIONS

Office Action dated Jul. 6, 2021 from corresponding application No. TW 11020642770 (pp. 1-7).

* cited by examiner

MULTI-PROTRUSION TRANSFER GATE MANUFACTURING METHOD

PRIORITY CLAIM

The present application is a continuation of U.S. application Ser. No. 16/850,524, filed Apr. 16, 2020, now U.S. Pat. No. 11,521,997, issued Dec. 6, 2022, which is incorporated herein by reference in its entirety.

BACKGROUND

Digital cameras and other optical imaging devices employ an image sensor that converts electromagnetic radiation into digital data used to form digital images. An image sensor typically is an integrated circuit (IC) that includes an array of pixel sensors, each of which generates an electrical signal based on electromagnetic illumination of a given area over a given time period. Pixel sensors are often based on complementary metal oxide semiconductor (CMOS) technology, in which case the image sensor is referred to as a CMOS image sensor (CIS).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
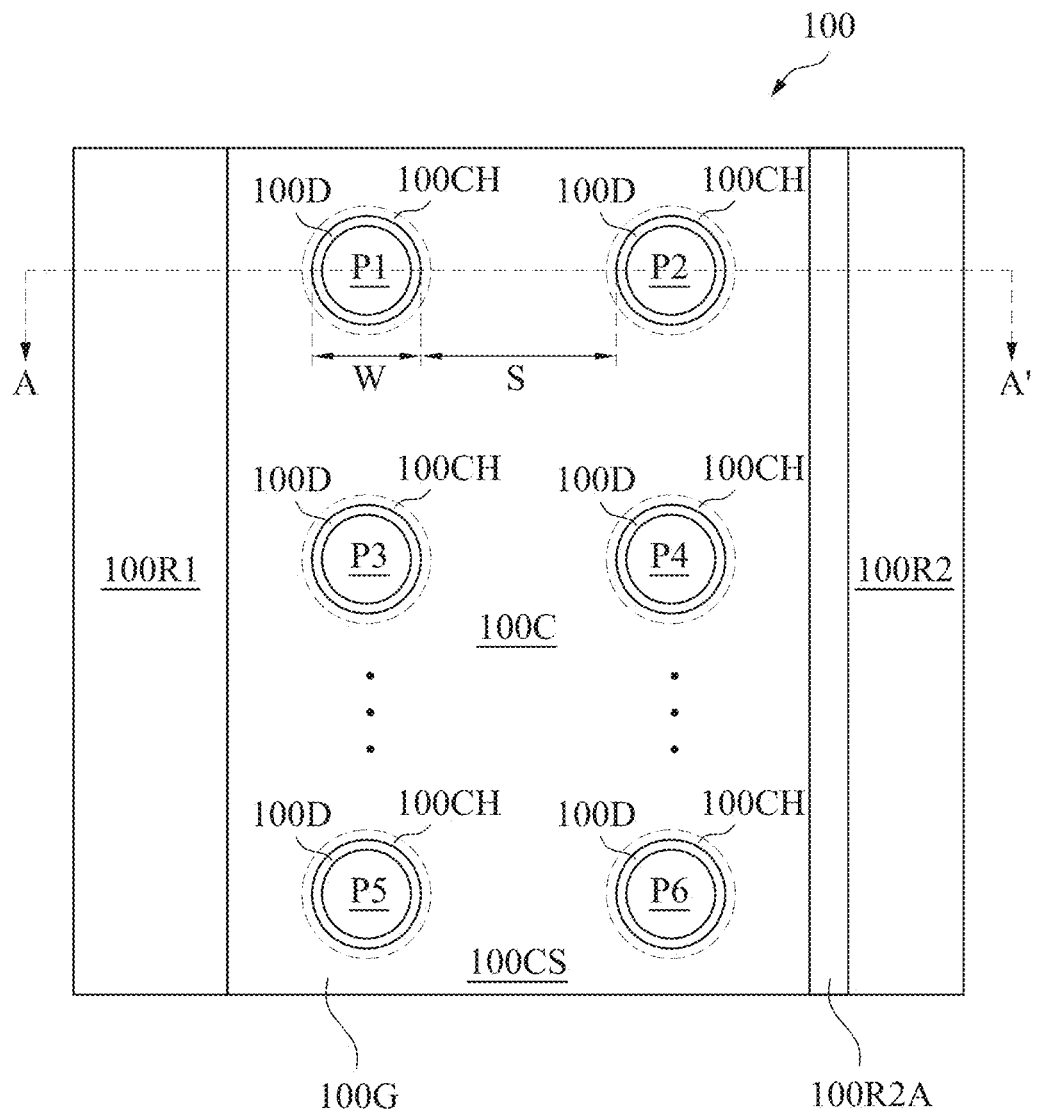
FIGS. 1A and 1B are diagrams of a transistor structure, in accordance with some embodiments.

The following disclosure provides many different embodiments, or examples, for implementing different features of the provided subject matter. Specific examples of components, materials, values, steps, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, a transistor structure includes a substrate region having a first doping type and first and second regions having a second doping type opposite the first doping type. A gate conductor of the transistor structure includes a plurality of conductive protrusions extending into the substrate region between the first and second regions. By including the plurality of conductive protrusions, channel area is increased and the transistor structure is capable of improving electron transmission efficiency between the first and second regions compared to approaches that do not include a plurality of conductive protrusions. In pixel transfer gate applications, particularly those in which deep photodiodes are used, the electron transmission efficiency improvement reduces lag times and occurrences of photodiode saturation, also known as white pixel (WP).

Figure 1B:
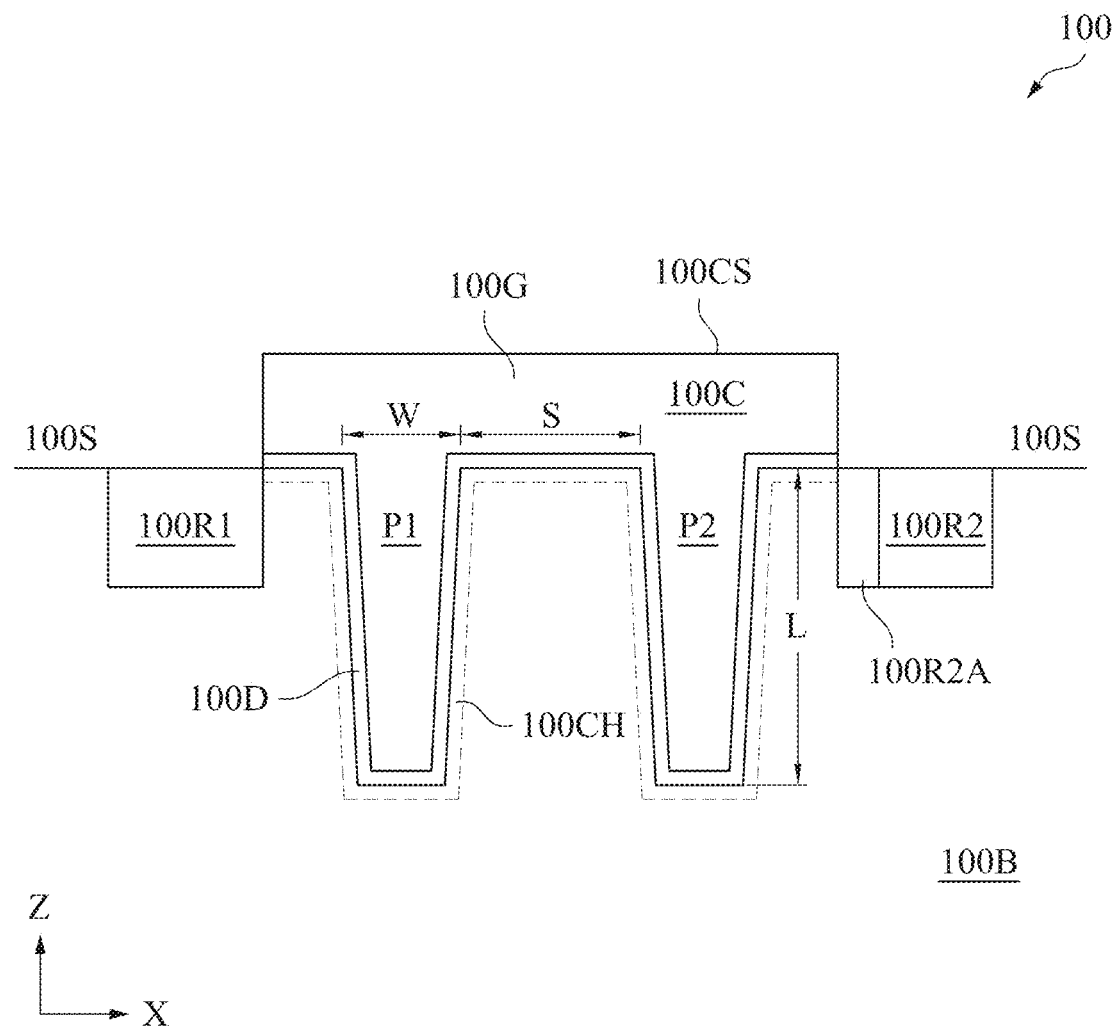

FIGS. 1A and 1B are diagrams of a transistor structure 100, in accordance with some embodiments. FIG. 1A depicts a plan view of transistor structure 100, an X direction, and a Y direction perpendicular to the X direction. FIG. 1B depicts a cross sectional view of transistor structure 100 along line A-A', the X direction, and a Z direction perpendicular to the X and Y directions. In various embodiments, transistor structure 100 is also referred to as transfer transistor structure 100 or IC structure 100.

As depicted in FIGS. 1A and 1B, transistor structure 100 includes a gate conductor 100G, also referred to as gate structure 100G in some embodiments, positioned between regions 100R1 and 100R2 along the X direction. Gate conductor 100G includes a conductive region 100C overlying a plurality of conductive protrusions P1-P6. A dielectric layer 100D contacts a lower surface (not labeled) of conductive region 100C and surrounds each conductive protrusion P1-P6. As further discussed below, the number and positioning of conductive protrusions P1-P6 depicted in FIGS. 1A and 1B is a non-limiting example presented for the purpose of illustration.

As illustrated in FIG. 1B, regions 100R1 and 100R2 are positioned within a substrate 100B having an upper surface 100S extending in the X and Y directions. Conductive protrusions P1-P6 extend into substrate 100B in the negative Z direction, perpendicular to upper surface 100S, and are also referred to as vertical gate structures P1-P6 in some embodiments. Conductive region 100C is continuous with each conductive protrusion P1-P6 and electrically isolated from substrate 100B by dielectric layer 100D.

Gate conductor 100G, dielectric layer 100D, and regions 100R1 and 100R2 of transistor structure 100 are arranged as depicted in FIGS. 1A and 1B for the purpose of illustration. In various embodiments, transistor structure 100 includes gate conductor 100G, dielectric layer 100D, and regions 100R1 and 100R2 arranged other than as depicted in FIGS. 1A and 1B, as discussed below.

In the embodiment depicted in FIGS. 1A and 1B, transistor structure 100 includes both of regions 100R1 and 100R2. In various embodiments, transistor structure 100 does not include one or both of regions 100R1 and 100R2, and the one or both of regions 100R1 and 100R2 is part of one or more IC structures (not shown) separate from transistor structure 100. In various embodiments, one of regions 100R1 or 100R2 is a photodiode of a pixel sensor, e.g., a photodiode 300PD of a pixel sensor 300 or 300P discussed below with respect to FIGS. 3A-3C, and/or the other of regions 100R1 or 100R2 is a floating diffusion (FD) region or node of the pixel sensor. A region or node of a circuit is referred to as floating based on a configuration by which the region or node is capable of being simultaneously decoupled from other circuit elements, e.g., through one or more open transistors and/or one or more reverse-biased diodes.

As further discussed below, transistor structure 100 is thereby usable as some or all of a transfer transistor of a pixel sensor, e.g., pixel sensor 300 or 300P discussed below with respect to FIGS. 3A-3C, a pixel sensor circuit, e.g., a pixel sensor circuit 200 discussed below with respect to FIG. 2, and in some embodiments, as one of a plurality of transfer transistors of an image sensor, e.g., a pixel sensor array 400 discussed below with respect to FIG. 4. Transistor structure 100 is thereby further usable as some or all of a transistor of another type of IC device, e.g., a logic, memory, or other IC device including one or more transistors having the properties discussed below.

Substrate 100B, also referred to as substrate region 100B in some embodiments, is a portion of a semiconductor wafer suitable for forming one or more IC devices. In various embodiments, substrate 100B includes n-type silicon (Si) including one or more donor dopants, e.g., phosphorous (P) or arsenic (As), referred to as having n-type doping in some embodiments, or p-type silicon including one or more acceptor dopants, e.g., boron (B) or aluminum (Al), referred to as having p-type doping in some embodiments. In some embodiments, substrate 100B includes a compound semiconductor, e.g., indium phosphide (InP), gallium arsenide (GaAs), silicon germanium (SiGe), indium arsenide (InAs), silicon carbide (SiC), or another suitable compound semiconductor material. In various embodiments, substrate 100B includes a bulk silicon layer or a silicon-on-insulator (SOI) substrate, e.g., a silicon layer separated from a bulk silicon layer by a buried oxide (BOX) layer.

Regions 100R1 and 100R2 are regions within substrate 100B having a doping type opposite that of substrate 100B, e.g., by including one or more of the dopants discussed above with respect to substrate 100B. In some embodiments, substrate 100B has p-type doping and each of regions 100R1 and 100R2 has n-type doping.

In some embodiments, one or both of regions 100R1 or 100R2 includes one or more epitaxial layers. In various embodiments, one or both of substrate regions 100R1 or 100R2 includes one or more of silicon, InP, Ge, GaAs, SiGe, InAs, SiC, or another suitable semiconductor material.

Conductive region 100C and conductive protrusions P1-P6 include one or more conductive materials capable of distributing charge throughout gate conductor 100G. In various embodiments, conductive materials include one or more of polysilicon, copper (Cu), aluminum (Al), tungsten (W), cobalt (Co), ruthenium (Ru), or one or more other metals, and/or one or more other suitable materials.

Dielectric layer 100D includes one or more dielectric materials capable of capacitively coupling gate conductor 100G to substrate 100B by electrically isolating a charge distributed throughout gate conductor 100G from substrate 100B. In some embodiments, dielectric layer 100D includes one or more high-k dielectric materials, i.e., a material having a dielectric constant above 3.9, the dielectric constant of silicon dioxide ($SiO_2$). In various embodiments, dielectric materials include one or more of $SiO_2$, silicon nitride, ($Si_3N_4$), aluminum oxide ($Al_2O_3$), hafnium oxide ($HfO_2$), tantalum pentoxide ($Ta_2O_5$), titanium oxide ($TiO_2$), or another suitable material.

Gate conductor 100G and dielectric layer 100D are thereby configured to, in operation, form a conductive channel 100CH in substrate 100B adjacent to dielectric layer 100D based on a charge distributed throughout gate conductor 100G.

By the arrangement and compositions discussed above, transistor structure 100 is configured as a transistor including gate conductor 100G positioned between regions 100R1 and 100R2 configured as source/drain features. At least a portion of each of conductive protrusions P1-P6 is positioned between regions 100R1 and 100R2. In some embodiments, region 100R1 is configured as a source feature of transistor structure 100 and region 100R2 is configured as a drain feature of transistor structure 100.

In the embodiment depicted in FIGS. 1A and 1B, region 100R2 includes a lightly doped region 100R2A. In some embodiments, lightly doped region 100R2A is an n-type region referred to as a pixel n-type lightly doped drain (PNLD). In some embodiments, region 100R2 does not include lightly doped region 100R2A.

In some embodiments, transistor structure 100 includes one or more contacts, vias, and/or other conductive features (not shown) in contact with one or more of regions 100R1 or 100R2 or gate conductor 100G, and transistor structure 100 is thereby configured to electrically connect the one or more of regions 100R1 or 100R2 or gate conductor 100G to one or more IC structures and/or devices (not shown) separate from transistor structure 100.

In the embodiment depicted in FIGS. 1A and 1B, gate conductor 100G includes a total of six conductive protrusions P1-P6 arranged in three rows of two conductive protrusions per row, e.g., conductive protrusions P1 and P2 depicted in FIG. 1B, thereby forming two columns. In various embodiments, gate conductor 100G includes conductive protrusions arranged in fewer or greater than three rows and/or fewer or greater than two columns.

In various embodiments, gate conductor 100G includes a total number of conductive protrusions less than or greater than six. In some embodiments, gate conductor 100G includes a total of two conductive protrusions, e.g., the single row of conductive protrusions P1 and P2 or a single column of conductive protrusions P1 and P3. In some embodiments, gate conductor 100G includes a total number of conductive protrusions ranging from three to twelve. Gate conductor 100G including conductive protrusions having other total numbers, e.g., those in accordance with ranges other than the ranges discussed above, are within the scope of the present disclosure.

In the embodiment depicted in FIGS. 1A and 1B, gate conductor 100G includes conductive protrusions, e.g., conductive protrusions P1-P6, arranged in an array of rows and columns. In various embodiments, gate conductor 100G includes conductive protrusions having one or more arrangements other than or in addition to that of an array, e.g., staggered rows and/or columns, a circular or concentric ring pattern, a triangle pattern, a zigzag pattern, a combination of patterns, and/or one or more predetermined locations independent of a pattern.

In the embodiment depicted in FIGS. 1A and 1B, conductive protrusions P1-P6 have a shape in the X-Y plane of a circle having a diameter given by width W, including dielectric 100D. In the embodiment depicted in FIGS. 1A and 1B, conductive protrusions P1-P6 have a tapered shape in the X-Z plane and the Y-Z plane (not shown), narrowing along the negative Z direction, and width W corresponds to a largest diameter of conductive protrusions P1-P6.

In various embodiments, conductive protrusions P1-P6 have a shape in the X-Y plane other than that of a circle, e.g., a square or other rectangular shape or an irregular shape, and width W corresponds to a largest dimension in the X-Y plane, e.g., a diagonal of a rectangle.

In some embodiments, conductive protrusions P1-P6 have a tapered shape in a single one of the X-Z or Y-Z planes, narrowing along the negative Z direction. In some embodiments, conductive protrusions P1-P6 do not have a tapered shape in either of the X-Z and Y-Z planes, and width W does not vary with respect to the Z direction.

A given conductive protrusion, e.g., conductive protrusion P1, is separated from a nearest other conductive protrusion, e.g., conductive protrusion P2, by a distance equal to or greater than a minimum spacing S. In some embodiments, minimum spacing S is greater than or equal to one half of width W.

In the embodiment depicted in FIGS. 1A and 1B, each conductive protrusion P1-P6 is separated from a nearest conductive protrusion along a given X or Y direction by approximately a same distance corresponding to minimum spacing S, and from other conductive protrusions by distances greater than minimum spacing S, thereby being separated from the remainder of the conductive protrusions by one or more distances approximately equal to or greater than minimum spacing S. In various embodiments, gate conductor 100G is otherwise configured such that a given conductive protrusion is separated from the remainder of the conductive protrusions by one or more distances approximately equal to or greater than minimum spacing S.

Multiple features are considered to have approximately a same dimension, e.g., width W or minimum spacing S, based on one or more features being within a manufacturing tolerance of a same nominal value of the dimension.

In the embodiment depicted in FIGS. 1A and 1B, each conductive protrusion P1-P6 has approximately a same length L, extending in the negative Z direction away from conductive region 100C. In various embodiments, one or more conductive protrusions, e.g., a conductive protrusion P1-P6, has a length L different from a length of one or more other conductive protrusions, e.g., another conductive protrusion P1-P6.

In operation, electrons are transmitted to and/or from conductive protrusions P1-P6 from and/or to regions 100R1 and 100R2 based on an average electron transmission path length between the conductive protrusions P1-P6 and the corresponding region 100R1 or 100R2. As a value of length L increases from zero relative to a size of the corresponding region 100R1 or 100R2, the average transmission path length initially decreases based on increasing overlap in the Z direction, then increases as length L corresponds to conductive protrusions P1-P6 extending beyond the corresponding region 100R1 or 100R2 in the negative Z direction. In some embodiments, length L has a value ranging from 100 angstroms (Å) to 10,000 Å. In some embodiments, length L has a value ranging from 1000 Å to 4000 Å. Length L having other values, e.g., those in accordance with ranges other than the ranges discussed above, are within the scope of the present disclosure.

In addition to upper surface 100S, substrate 100B includes a lower surface (not shown) such that a distance between the lower surface and upper surface 100S defines a substrate thickness. In some embodiments, length L has a value ranging from 3% to 90% of the substrate thickness. Length L having other values relative to substrate thickness, e.g., those in accordance with ranges other than the ranges discussed above, are within the scope of the present disclosure.

In the embodiment depicted in FIGS. 1A and 1B, conductive region 100C extends above upper surface 100S in the positive Z direction, and thereby includes a top surface 100CS above upper surface 100S. In various embodiments, conductive region 100C is coextensive with upper surface 100S in the positive Z direction such that top surface 100CS is coplanar with upper surface 100S, or conductive region 100C does not extend to upper surface 100S in the positive Z direction such that top surface 100CS is below upper surface 100S.

In the embodiment depicted in FIGS. 1A and 1B, an entirety of conductive region 100C is positioned above upper surface 100S in the positive Z direction. In various embodiments, a portion or an entirety of conductive region 100C is positioned at and/or below upper surface 100S in the negative Z direction.

In the embodiment depicted in FIGS. 1A and 1B, conductive region 100C extends away from conductive protrusion P1 in the negative X direction such that portions of each of conductive region 100C and dielectric layer 100D overlie, in the positive Z direction, a portion of substrate 100B between conductive protrusion P1 and region 100R1. In some embodiments, conductive region 100C does not extend away from conductive protrusion P1 in the negative X direction, and conductive region 100C and dielectric layer 100D do not include portions that overlie, in the positive Z direction, a portion of substrate 100B between conductive protrusion P1 and region 100R1.

In the embodiment depicted in FIGS. 1A and 1B, conductive region 100C extends away from conductive protrusion P2 in the positive X direction such that portions of each of conductive region 100C and dielectric layer 100D overlie, in the positive Z direction, a portion of substrate 100B between conductive protrusion P2 and region 100R2. In some embodiments, conductive region 100C does not extend away from conductive protrusion P2 in the positive X direction, and conductive region 100C and dielectric layer 100D do not include portions that overlie, in the positive Z direction, a portion of substrate 100B between conductive protrusion P2 and region 100R2.

In the embodiment depicted in FIGS. 1A and 1B, region 100R1 extends in the positive X direction up to an edge of conductive region 100C. In various embodiments, region 100R1 extends in the positive X direction beyond the edge of conductive region 100C such that conductive region 100C overlies region 100R1 in the positive Z direction, or region 100R1 does not extend in the positive X direction up to the edge of conductive region 100C such that region 100R1 and conductive region 100C are separated by a gap (not shown).

In the embodiment depicted in FIGS. 1A and 1B, region 100R2 extends in the negative X direction up to an edge of conductive region 100C. In various embodiments, region 100R2 extends in the negative X direction beyond the edge of conductive region 100C such that conductive region 100C overlies region 100R2 in the positive Z direction, or region 100R2 does not extend in the negative X direction up to the edge of conductive region 100C such that region 100R2 and conductive region 100C are separated by a gap (not shown).

In the embodiment depicted in FIGS. 1A and 1B, each of regions 100R1 and 100R2 is coplanar with upper surface 100S. In some embodiments, one or both of region 100R1 or 100R2 extends in the positive Z direction above upper surface 100S and thereby includes a topmost portion above upper surface 100S. In some embodiments, one or both of region 100R1 or 100R2 does not extend in the positive Z direction to upper surface 100S and thereby includes the topmost portion below upper surface 100S.

In the embodiment depicted in FIGS. 1A and 1B, each of conductive protrusions P1-P6 extends in the negative Z direction beyond a bottommost portion of each of regions 100R1 and 100R2. In some embodiments, one or both of region 100R1 or 100R2 extends in the negative Z direction beyond a bottommost portion of at least one of conductive protrusions P1-P6. In some embodiments, one or both of region 100R1 or 100R2 extends in the negative Z direction beyond the bottommost portions of all of conductive protrusions P1-P6.

By the configuration discussed above, transistor structure 100 includes gate conductor 100G including conductive protrusions P1-P6 extending into substrate region 100B between regions 100R1 and 100R2. By including conductive protrusions P1-P6, a volume of conductive channel 100CH is increased and the transistor is capable of improving electron transmission efficiency between regions 100R1 and 100R2 compared to approaches that do not include a plurality of conductive protrusions, e.g., conductive protrusions P1-P6.

The improved transmission efficiency is especially effective in applications in which electrons are transmitted to and/or from one or more adjacent features that extend alongside conductive protrusions, based on reducing the average electron transmission path length between the one or more adjacent features and the conductive protrusions. For example, in the pixel transfer gate applications discussed below, the transmission efficiency improvement reduces lag times and WP occurrences compared to approaches that do not include a plurality of conductive protrusions.

Figure 2:
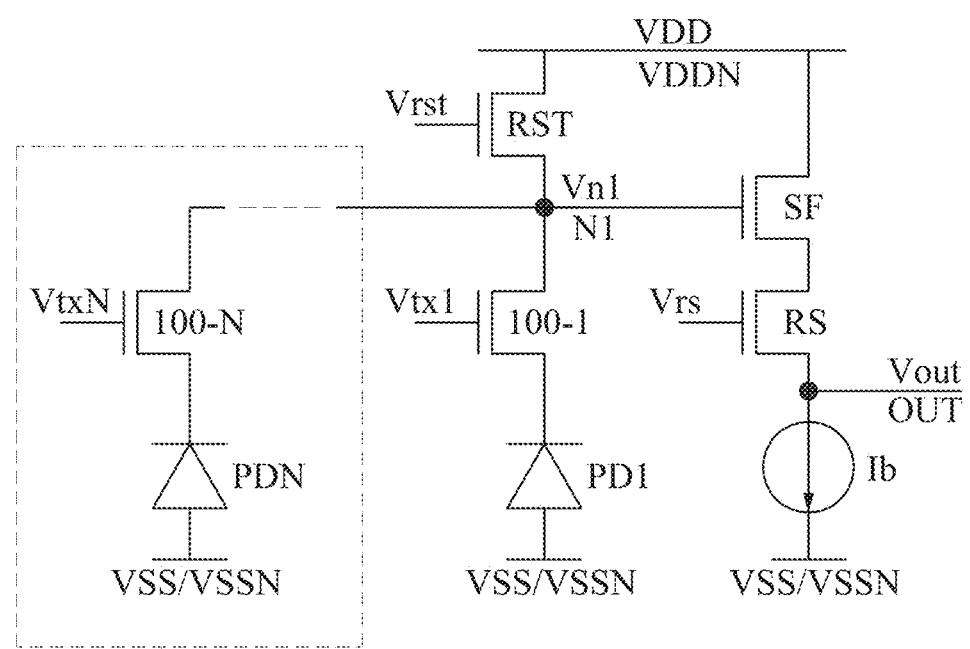
FIG. 2 is a schematic diagram of a pixel sensor circuit, in accordance with some embodiments.

FIG. 2 is a schematic diagram of a pixel sensor circuit 200, in accordance with some embodiments. Pixel sensor circuit 200 includes a transistor structure 100-1, an instance of transistor structure 100 discussed above with respect to FIGS. 1A and 1B. Pixel sensor circuit 200 also includes power supply nodes VDDN and VSSN, an internal node N1, and an output node OUT. A transistor RST is coupled between power supply node VDDN and internal node N1, and transistor structure 100-1 and a photodiode PD1 are coupled in series between internal node N1 and power supply node VSSN. The cathode of photodiode PD1 is coupled to transistor structure 100-1, and the anode of photodiode PD1 is coupled to power supply node VSSN. Transistors SF and RS are coupled in series between power supply node VDDN and output node OUT, a gate of transistor SF is coupled to internal node N1, and a current source Ib is coupled between output node OUT and power supply node VSSN.

Two or more circuit elements are considered to be coupled based on a direct electrical connection or an electrical connection that includes one or more additional circuit elements, e.g., one or more logic or transmission gates, and is thereby capable of being controlled, e.g., made resistive or open by a transistor or other switching device.

In some embodiments, pixel sensor circuit 200 includes one or more additional instances of transistor structure 100 and corresponding photodiodes coupled in series between internal node N1 and power supply node VSSN, represented as an Nth transistor structure 100-N and photodiode PDN in the dashed box in FIG. 2. In some embodiments, pixel sensor circuit 200 includes a total number N of transistor structures 100-1-100-N and corresponding photodiodes PD1-PDN ranging from two to four. In the discussion below, references to transistor structures 100-1-100-N and photodiodes PD1-PDN include the case in which N=1 and pixel sensor circuit 200 includes the single transistor structure 100-1 and the single photodiode PD1.

In some embodiments, a single transistor structure 100-1 coupled in series with photodiode PD1 corresponds to pixel sensor 300 discussed below with respect to FIGS. 3A and 3B. In some embodiments, a total number N of transistor structures 100-1-100-N and corresponding photodiodes PD1-PDN equal to four corresponds to pixel sensor 300P discussed below with respect to FIG. 3C. In some embodiments, pixel sensor circuit 200 is one pixel sensor circuit of a pixel sensor array, e.g., pixel sensor array 400 discussed below with respect to FIG. 4.

In some embodiments, pixel sensor circuit 200 includes one or more circuit elements (not shown) in addition to the elements cited above, e.g., one or more transistors and/or resistive devices coupled between power supply node VDDN and internal node N1.

Power supply node VDDN is a circuit node configured to carry a power supply voltage VDD having a power supply voltage level, e.g., an operating voltage level of a power domain including pixel sensor circuit 200. Power supply node VSSN is a circuit node configured to carry a power supply voltage VSS having a power supply reference level, e.g., a ground level, of the power domain including pixel sensor circuit 200.

In the embodiment depicted in FIG. 2, each of transistors RST, SF, and RS and transistor structures 100-1-100-N is an n-type metal-oxide semiconductor (NMOS) transistor. In various embodiments, one or more of transistors RST, SF, or RS or transistor structures 100-1-100-N is a p-type metal-oxide semiconductor (PMOS) transistor.

A gate of transistor RST is configured to receive a signal Vrst, gates of transistor structures 100-1-100-N are configured to receive respective signals Vtx1-VtxN, a gate of transistor RS is configured to receive a signal Vrs, and a gate of transistor SF is configured to receive a voltage Vn1 on internal node N1. Current source Ib is configured to control a current, also referred to as current Ib, through the series of transistors SF and RS.

In operation, one or more of photodiodes PD1-PDN is exposed to electromagnetic radiation, e.g., light, for a predetermined period of time and, in response to one or more intensity levels of the electromagnetic radiation, accumulate one or more charge levels on the corresponding cathode(s) representative of the one or more intensity levels. In some embodiments, the one or more intensity levels is an intensity level of light. In some embodiments, the one or more intensity levels include multiple intensity levels based on corresponding separate frequencies of the electromagnetic radiation.

In various embodiments, pixel sensor circuit 200 has a back-side illumination (BSI) or front-side illumination (FSI) configuration and, in operation, the electromagnetic radiation is received by the one or more of photodiodes PD1-PDN from a respective back or front direction, e.g., the respective negative or positive Z direction discussed below with respect to FIGS. 3A-3C.

In response to one or more of signals Vtx1-VtxN, in operation, the corresponding one or more of transistors 100-1-100-N closes, thereby causing a portion of the accumulated charge to be transferred to internal node N1 and generating voltage Vn1 having a voltage level representative of the one or more intensity levels. In some embodiments, signals Vtx1-VtxN are referred to as transfer or control signals of a pixel sensor array including pixel sensor circuit 200. In some embodiments, the pixel sensor array is configured to generate signals Vtx1-VtxN causing one or more of transistor structures 100-1-100-N to close corresponding to controlling one or more predetermined exposure periods of the pixel sensor array, e.g., after opening and closing a shutter of the pixel sensor array.

In response to signal Vrs, in operation, transistor RS closes, thereby establishing a current path by which current Ib flows through transistor SF, the gate of which is biased by the voltage level of voltage Vn1 on internal node N1. In some embodiments, signal Vrs is referred to as a row select signal of a pixel sensor array including pixel sensor circuit 200. In some embodiments, the pixel sensor array is configured to generate signal Vrs causing transistor Rs to close as part of a row selection operation.

By the arrangement discussed above, transistor SF has a source follower configuration by which, in operation, an output voltage Vout is generated on output node OUT having an output voltage level that follows the voltage level of voltage Vn1 on internal node N1.

In response to signal Vrst, in operation, transistor RST closes, thereby selectively coupling internal node N1 to power supply node VDDN and discharging internal node N1. In some embodiments, signal Vrst is referred to as a reset signal of a pixel sensor array including pixel sensor circuit 200. In some embodiments, the pixel sensor array is configured to generate signal Vrst causing transistor RST to close corresponding to controlling one or more predetermined exposure periods of the pixel sensor array, e.g., coordinated with opening and/or closing a shutter of the pixel sensor array.

Pixel sensor circuit 200 is thereby configured to, in operation, generate output voltage Vout on output node OUT having an output voltage level representative of a voltage level of voltage Vn1 on internal node N1, thereby being representative of one or more charge levels transferred to internal node N1 through one or more pairs of transistor structures 100-1-100-N and photodiodes PD1-PDN, and thereby being representative of one or more intensity levels of the electromagnetic radiation received by photodiodes PD1-PDN.

By the configuration depicted in FIG. 2 and discussed above, pixel sensor circuit 200 includes one or more instances of transistor structure 100 configured as a transfer transistor coupled between a photodiode and an internal node. In various embodiments, pixel sensor circuit 200 has a configuration other than that depicted in FIG. 2 such that transistor structure 100 is otherwise configured as a transfer transistor coupled between a photodiode and an internal node.

Pixel sensor circuit 200 is thereby capable of realizing the benefits discussed above with respect to transistor structure 100. Because each of the one or more instances of transistor structure 100 includes conductive protrusions, e.g., conductive protrusions P1-P6 discussed above with respect to FIGS. 1A and 1B, compared to approaches that do not include a plurality of conductive protrusions, the efficiency by which charge is transferred to internal node N1 is improved such that lag times for charge transfer are reduced and occurrences of photodiode cathode saturation (WP) are avoided.

Figure 3A:
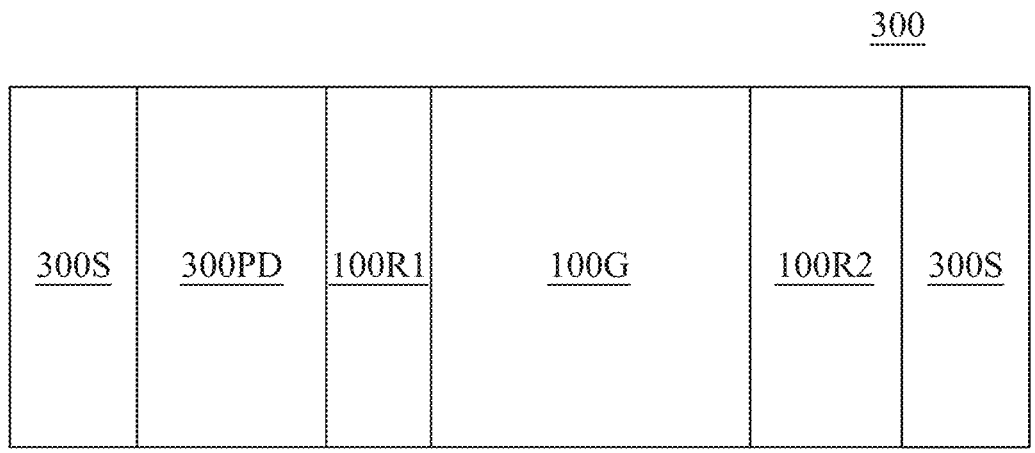
FIGS. 3A-3C are diagrams of pixel sensors, in accordance with some embodiments.
Figure 3B:
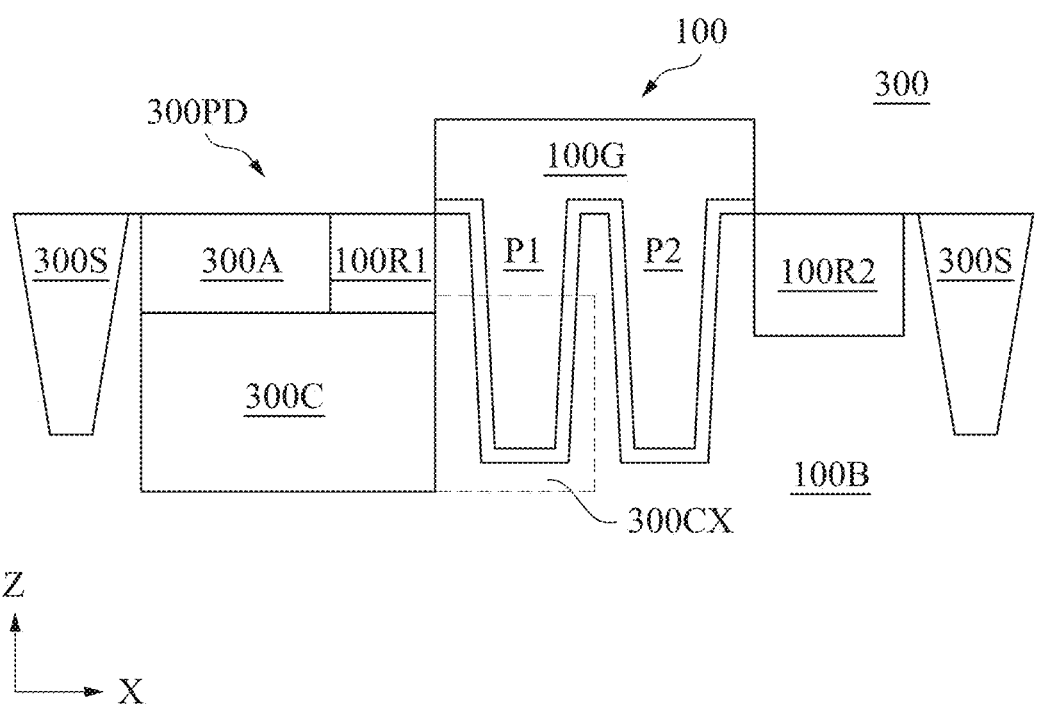
Figure 3C:
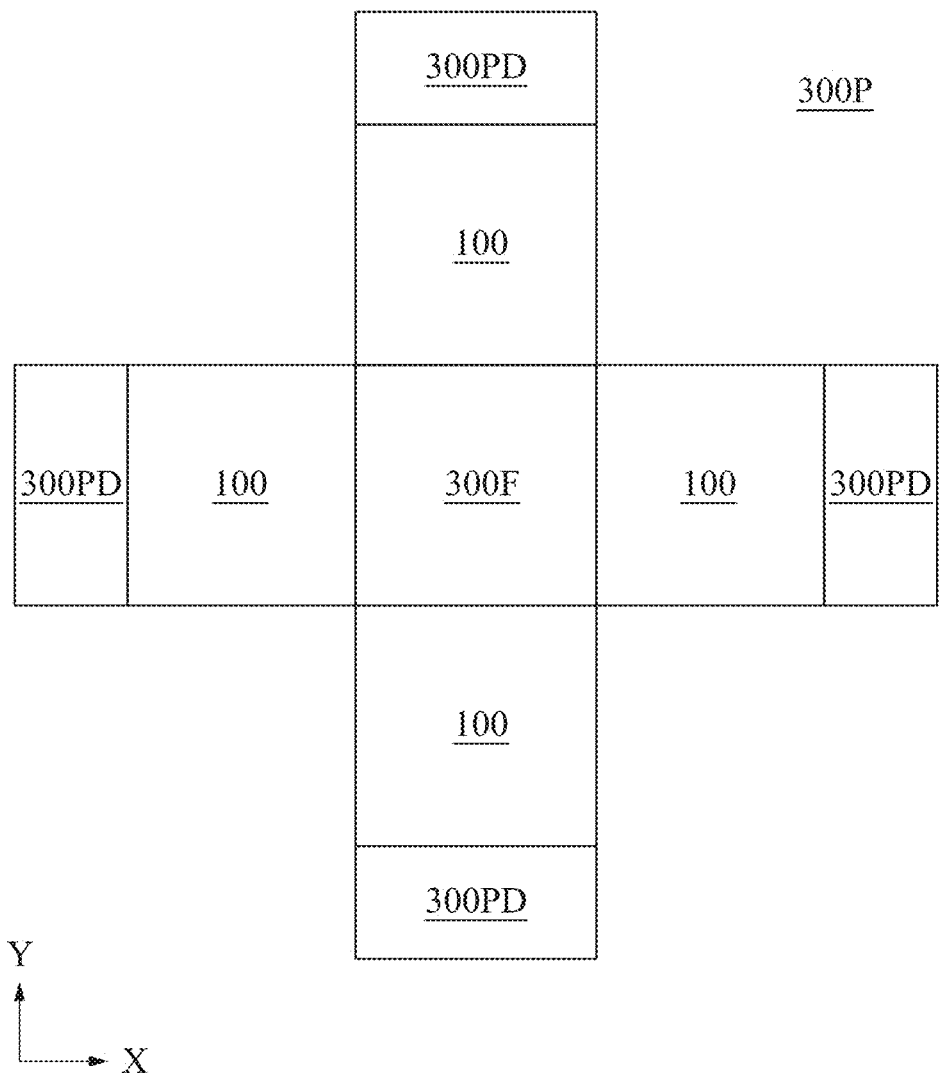

FIGS. 3A-3C are diagrams of pixel sensors 300 and 300P, in accordance with some embodiments. FIG. 3A is a plan view of pixel sensor 300 in the X-Y plane, FIG. 3B is a cross-sectional view of pixel sensor 300 in the X-Z plane, and FIG. 3C is a plan view of pixel sensor 300P in the X-Y plane. Pixel sensor 300 is an IC device usable as a combination of one of transistor structures 100-1-100-N coupled in series with the corresponding one of photodiodes PD1-PDN, discussed above with respect to FIG. 2, and pixel sensor 300P is an IC device usable as a combination of transistor structures 100-1-100-N collectively coupled in series with corresponding photodiodes PD1-PDN for the case in which N=4.

Pixel sensor 300 includes transistor structure 100 including gate conductor 100G and regions 100R1 and 100R2 within substrate 100B, each discussed above with respect to FIGS. 1A and 1B, a photodiode 300PD, and two instances of an isolation structure 300S. Pixel sensor 300P includes four instances of transistor structure 100, four instances of photodiode 300PD, and a floating diffusion node (FDN) 300F corresponding collectively to the regions 100R2 of the four instances of transistor structure 100.

The depictions of pixel sensors 300 and 300P in FIGS. 3A-3C are simplified for the purpose of illustration. In various embodiments, pixel sensors 300 and 300P include elements (not shown), e.g., transistors, conductive features, and/or isolation structures, in addition to the elements depicted in FIGS. 3A-3C. In some embodiments, transistor structure 100 has a configuration other than that depicted in FIG. 3B, as discussed above with respect to FIGS. 1A and 1B.

Isolation structures 300S are regions within substrate 100B including one or more dielectric materials configured to electrically isolate pixel sensor 300 from adjacent IC devices, e.g., additional instances of pixel sensor 300.

Photodiode 300PD is a photodetector structure including an anode 300A adjacent to a cathode 300C. Anode 300A is a p-type region in substrate 100B, cathode 300C is an n-type region in substrate 100B, and pixel sensor 300 is configured to, in operation, respond to exposure to electromagnetic radiation by accumulating electronic charge in cathode 300C, also referred to as a collector in some embodiments. In some embodiments, photodiode 300PD is referred to as a deep photodiode.

In some embodiments, pixel sensor 300 and/or 300P is configured such that, in operation, photodiode 300PD responds to electromagnetic radiation received from the negative Z direction, thereby corresponding to a BSI configuration. In some embodiments, pixel sensor 300 and/or 300P is configured such that, in operation, photodiode 300PD responds to electromagnetic radiation received from the positive Z direction, thereby corresponding to an FSI configuration.

As depicted in FIGS. 3A and 3B, pixel sensor 300 includes transistor structure 100 and photodiode 300PD positioned adjacent to each other and between isolation structures 300S along the X direction, at least a portion of each of the conductive protrusions of gate conductor 100G, e.g., conductive protrusions P1 and P2, thereby being positioned between cathode 300C and region 100R2. In the embodiment depicted in FIGS. 3A and 3B, substrate 100B has p-type doping and each of regions 100R1 and 100R2 has n-type doping.

In the embodiment depicted in FIGS. 3A and 3B, region 100R1 and cathode 300C are separate regions in substrate 100B, and region 100R1 is adjacent to anode 300A. In some embodiments, region 100R1 and cathode 300C are a single, continuous region in substrate 100B. In some embodiments, region 100R1 and anode 300A are separated within substrate 100B by a gap (not shown).

As depicted in FIG. 3B, in some embodiments, cathode 300C includes a portion 300CX extending in the positive X direction, and conductive protrusion P1 extends into portion 300CX of cathode 300C. In various embodiments in which cathode 300C includes portion 300CX extending in the positive X direction, one or more conductive protrusions of gate conductor 100G, e.g., conductive protrusion P2, in addition to conductive protrusion P1 extends into portion 300CX of cathode 300C.

As depicted in FIGS. 3A and 3B and discussed above, pixel sensor 300 is configured to, in operation, accumulate a charge on cathode 300C in response to electromagnetic radiation and, in response to a voltage on gate conductor 100G, transfer at least a portion of the accumulated charge to region 100R2 through a conduction channel (not shown in FIGS. 3A and 3B) corresponding to the conductive protrusions of gate conductor 100G, e.g., conductive protrusions P1 and P2.

Anode 300A and cathode 300C of photodiode 300PD are arranged as depicted in FIG. 3B for the purpose of illustration. In various embodiments, photodiode 300PD includes anode 300A and cathode 300C arranged other than as depicted in FIG. 3B, e.g., by having shapes, sizes, and/or relative positioning other than those depicted in FIG. 3B, such that pixel sensor 300 is configured to operate as discussed above. In some embodiments, photodiode 300PD includes one or more elements (not shown) in addition to anode 300A and cathode 300C such that pixel sensor 300 is configured to operate as discussed above. In some embodiments, photodiode 300PD includes a p-type region (not shown) in addition to anode 300A and is thereby configured as a pinned photodiode such that pixel sensor 300 is configured to operate as discussed above.

As depicted in FIG. 3C, pixel sensor 300P includes two instances of photodiode 300PD, two instances of transistor structure 100, and FDN 300F aligned in the X direction, and two instances of photodiode 300PD, two instances of transistor structure 100, and FDN 300F aligned in the Y direction. Each instance of transistor structure 100 is positioned between FDN 300F and a corresponding instance of photodiode 300PD, thereby having a cross-sectional configuration equivalent to that of pixel sensor 300 depicted in FIG. 3B, but without an instance of isolation structure 300S adjacent to FDN 300F (region 100R2). Additional elements, e.g., one or more isolation structures, of pixel sensor 300P are not shown in FIG. 3C for the purpose of clarity.

Pixel sensor 300P is thereby configured such that, in operation, a given instance of photodiode 300PD accumulates a charge on cathode 300C in response to electromagnetic radiation and, in response to a voltage on gate conductor 100G of the corresponding transistor structure 100, transfer at least a portion of the accumulated charge to FDN 300F through a conduction channel (not shown in FIG. 3C) corresponding to the conductive protrusions of gate conductor 100G, e.g., conductive protrusions P1 and P2, of the corresponding transistor structure 100.

Four instances of photodiode 300PD, four instances of transistor structure 100, and FDN 300F of pixel sensor 300P are arranged as depicted in FIG. 3C for the purpose of illustration. In various embodiments, pixel sensor 300P includes a total of two or three instances of each of photodiode 300PD and transistor structure 100 aligned accordingly such that pixel sensor 300P is configured to operate as discussed above. Numbers of instances of photodiode 300PD other than those discussed above are within the scope of the present disclosure.

Because each of pixel sensors 300 and 300P includes at least one instance of transistor structure 100 configured as discussed above, each of pixel sensors 300 and 300P is thereby capable of realizing the benefits discussed above with respect to transistor structure 100 and pixel sensor circuit 200.

Figure 4:
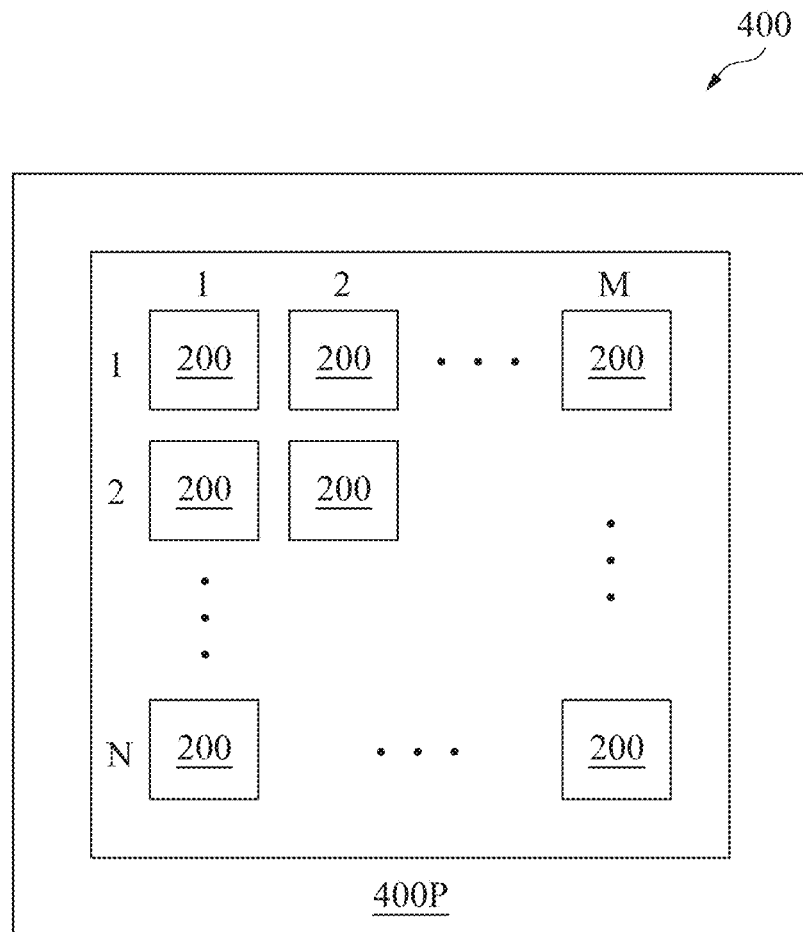
FIG. 4 is a diagram of a pixel sensor array, in accordance with some embodiments.

FIG. 4 is a diagram of pixel sensor array 400, in accordance with some embodiments. Pixel sensor array 400, also referred to as image sensor 400 in some embodiments, includes an array of N rows and M columns of pixel sensor circuits 200, discussed above with respect to FIG. 2, and peripheral circuit 400P. In various embodiments, pixel sensor array 400 has a BSI or FSI configuration as discussed above with respect to FIGS. 2-3C. Peripheral circuit 400P and pixel sensor circuits 200 are based on CMOS technology and, in some embodiments, pixel sensor array 400 is referred to as a CIS.

Peripheral circuit 400P is an electronic circuit including a controller and memory, thereby being configured to cause some or all of pixel sensor circuits 200 to generate a voltage representative of a corresponding electromagnetic radiation intensity such that a collective digital image based on the N rows and M columns of pixel sensor circuits 200 is generated in operation.

In some embodiments, pixel sensor array 400 includes a shutter (not shown) configured to cause some or all of pixel sensor circuits to be exposed to electromagnetic radiation for one or more predetermined exposure periods.

In some embodiments, pixel sensor array 400 includes one or more filters (not shown) configured to limit exposure of one or more subsets of pixel sensor circuits 200 to one or more electromagnetic radiation frequency ranges. In some embodiments, the one or more electromagnetic radiation frequency ranges correspond to red, green, and blue light.

In various embodiments, peripheral circuit 400P is configured to generate signals Vtx1-VtxN, Vrst, and/or Vrs and/or receive signal Vout corresponding to each pixel sensor circuit 200, as discussed above with respect to FIG. 2.

A digital image generated by pixel sensor array 400 in operation has a size based on a total pixel number equal to the number N of rows times the number M of columns of pixel sensor circuits 200. In some embodiments, pixel sensor array 400 includes the number N of rows ranging from 1000 to 10,000. In some embodiments, pixel sensor array 400 includes the number M of columns ranging from 1200 to 12,000. In some embodiments, pixel sensor array 400 includes the total pixel number ranging from 1 megapixel (MP) to 125 MP. In various embodiments, pixel sensor array 400 includes the total pixel number of 8 MP, 16 MP, 24 MP, 48 MP, 64 MP, or 128 MP. Pixel sensor array 400 including other total pixel numbers, e.g., those in accordance with ranges other than the ranges discussed above, are within the scope of the present disclosure.

For a given pixel number, pixel sensor array 400 has a width and height (not labeled) in the respective X and Y directions, and thereby a resolution, that depends on a size and spacing of pixel sensor circuits 200, referred to as a pitch in some embodiments. In some embodiments, pixel sensor circuits 200 of pixel sensor array 400 have a pitch ranging from 0.5 micrometers (μm) to 2.0 μm. In some embodiments, pixel sensor circuits 200 of pixel sensor array 400 have a pitch ranging from 0.75 μm to 1.0 μm. Pixel sensor array 400 including other pitch values, e.g., those in accordance with ranges other than the ranges discussed above, are within the scope of the present disclosure.

To accommodate decreasing pitch, a pixel sensor circuit, e.g., pixel sensor circuit 200, often includes elements, e.g., photodiode 300PD discussed above with respect to FIGS. 3A-3C, that extend perpendicular to the X and Y directions. Because pixel sensor circuits 200 of pixel sensor array 400 include the conductive protrusions, e.g., conductive protrusions P1-P6, of transistor structure 100, pixel sensor array 400 is thereby capable of realizing the benefits discussed above with respect to transistor structure 100 and pixel sensor circuit 200.

Figure 5:
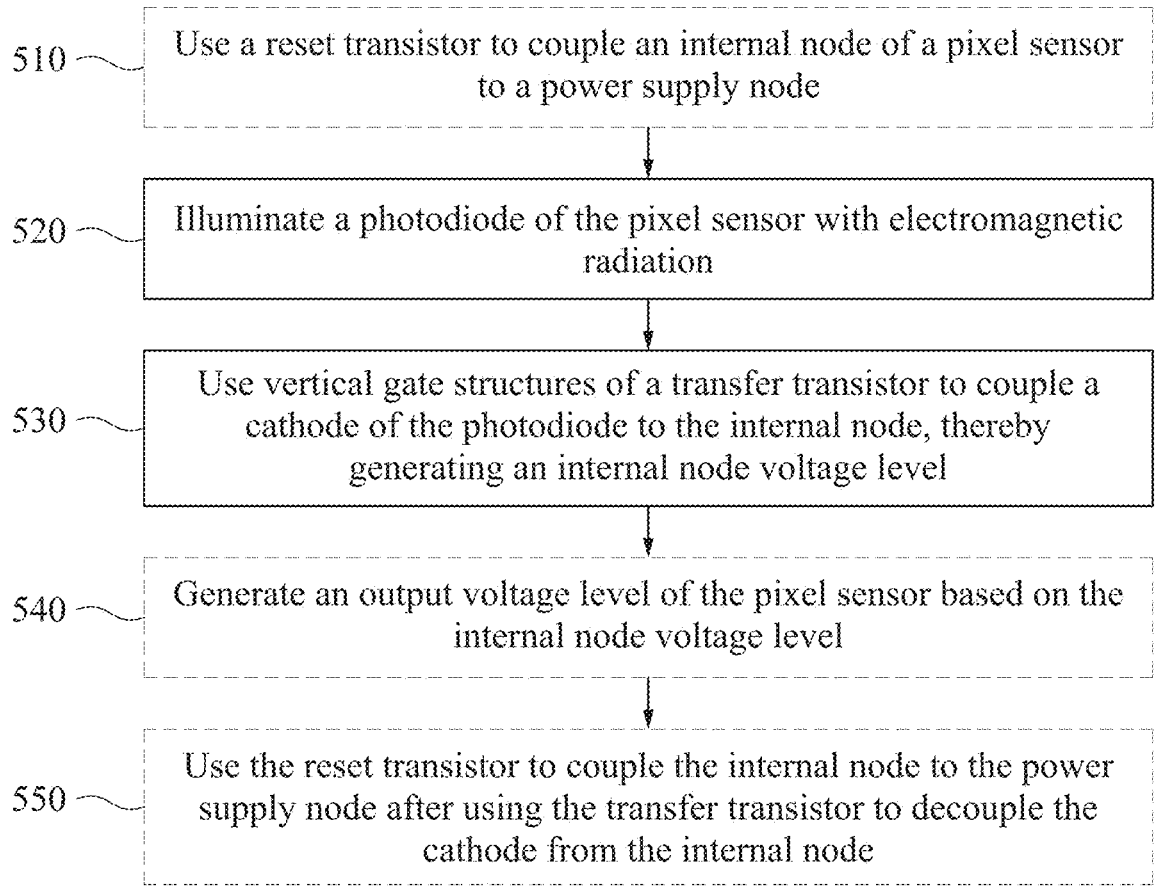
FIG. 5 is a flowchart of a method of operating a pixel sensor circuit, in accordance with some embodiments.

FIG. 5 is a flowchart of a method 500 of operating a pixel sensor, in accordance with some embodiments. The operations of method 500 are capable of being performed as part of a method of operating one or more IC devices including one or more pixel sensors, e.g., pixel sensor array 400 discussed above with respect to FIG. 4, pixel sensor 300 or 300P discussed above with respect to FIGS. 3A-3C, and/or pixel sensor circuit 200 discussed above with respect to FIG. 2.

In some embodiments, the operations of method 500 are performed in the order depicted in FIG. 5. In some embodiments, the operations of method 500 are performed in an order other than the order depicted in FIG. 5. In some embodiments, one or more operations are performed before, between, during, and/or after performing one or more operations of method 500.

At operation 510, in some embodiments, a reset transistor is used to couple an internal node of a pixel sensor to a power supply node. Using the reset transistor to couple the internal node to the power supply node causes the internal node to discharge some or all of a stored charge, thereby setting the internal node to a predetermined voltage level, e.g., a power supply voltage level of the power supply node. In some embodiments, coupling the internal node to the power supply node includes coupling a FDN to the power supply node.

In some embodiments, using the reset transistor to couple the internal node to the power supply node includes using transistor RST to couple internal node N1 to power supply node VDDN, discussed above with respect to FIG. 2. In some embodiments, using the reset transistor to couple the internal node to the power supply node includes coupling region 100R2, discussed above with respect to FIGS. 1A, 1B, 3A, and 3B, to the power supply node. In some embodiments, using the reset transistor to couple the internal node to the power supply node includes coupling FDN 300F, discussed above with respect to FIG. 3C, to the power supply node.

In some embodiments, using the reset transistor to couple the internal node to the power supply node corresponds to controlling one or more predetermined exposure periods of the pixel sensor. In some embodiments, using the reset transistor to couple the internal node to the power supply node corresponds to controlling one or more predetermined exposure periods of a pixel sensor array including the pixel sensor, e.g., pixel sensor array 400 discussed above with respect to FIG. 4.

At operation 520, a photodiode of the pixel sensor is illuminated with electromagnetic radiation, e.g., light. In some embodiments, illuminating the photodiode includes opening and closing a shutter for a predetermined period of time. In various embodiments, illuminating the photodiode includes performing a BSI or FSI operation, as discussed above with respect to FIGS. 1A-4.

In some embodiments, illuminating the photodiode with electromagnetic radiation includes using a filter to limit the electromagnetic radiation received by the photodiode to one or more electromagnetic radiation frequency ranges. In some embodiments, limiting the electromagnetic radiation to one or more electromagnetic radiation frequency ranges includes limiting the electromagnetic radiation to one of red, green, or blue light.

In some embodiments, illuminating the photodiode with electromagnetic radiation includes causing a charge to accumulate on a cathode of the photodiode, an amount of the charge being representative of an intensity level of the electromagnetic radiation.

In some embodiments, illuminating the photodiode with electromagnetic radiation includes illuminating photodiode 300PD discussed above with respect to FIGS. 3A-3C.

At operation 530, vertical gate structures of a transfer transistor are used to couple a cathode of the photodiode to the internal node, thereby generating an internal node voltage level. Using the vertical gate structures to couple the cathode to the internal node includes biasing the vertical gate structures to a common bias voltage level. In some embodiments, biasing the vertical gate structures to the common bias voltage level includes biasing a conductive region of a gate conductor of the transfer transistor, the conductive region being electrically connected to each of the vertical gate structures.

In some embodiments, biasing the vertical gate structures to the common bias voltage level includes biasing conductive protrusions, e.g., conductive protrusions P1-P6, of gate conductor 100G discussed above with respect to transistor structure 100 and FIGS. 1A and 1B. In some embodiments, biasing the vertical gate structures to the common bias voltage level includes receiving a signal at a gate of a transistor structure, e.g., receiving one of signals Vtx1-VtxN at a corresponding gate of one of transistor structures 100-1-100-N, as discussed above with respect to FIG. 2. In some embodiments, biasing the vertical gate structures to the common bias voltage level includes using a circuit to generate a control signal, e.g., using peripheral circuit 400P to generate one of signals Vtx1-VtxN, as discussed above with respect to FIG. 4.

Using the vertical gate structures to couple the cathode to the internal node includes using at least a portion of each vertical gate structure positioned between the photodiode and the internal node. In some embodiments using the at least a portion of each vertical gate structure includes using at least a portion of each of conductive protrusions, e.g., conductive protrusions P1-P6, of gate conductor 100G positioned between photodiode 300PD and region 100R2 or FDN 300F, as discussed above with respect to FIGS. 3A-3C.

Coupling the cathode of the photodiode to the internal node includes providing a conductive channel between the photodiode and the internal node in response to the bias voltage level. In various embodiments, providing the conductive channel includes establishing the conductive channel or enhancing an existing conductive channel. In some embodiments, providing the conductive channel includes providing conductive channel 100CH discussed above with respect to FIGS. 1A and 1B.

Coupling the cathode of the photodiode to the internal node includes coupling the cathode of the photodiode to the internal node of a pixel sensor. In some embodiments, coupling the cathode of the photodiode to the internal node of the pixel sensor includes coupling the cathode of one of photodiodes PD1-PDN to internal node N1 of pixel sensor circuit 200 discussed above with respect to FIG. 2. In various embodiments, coupling the cathode of the photodiode to the internal node of the pixel sensor includes coupling cathode 300C to region 100R2 of pixel sensor 300 or coupling an instance of cathode 300C to FDN 300F of pixel sensor 300P discussed above with respect to FIGS. 3A-3C.

Generating the internal node voltage level includes generating the internal node voltage level representative of the amount of the charge accumulated on the cathode of the photodiode, e.g., the cathode of one of photodiodes PD1-PDN discussed above with respect to FIG. 2 or cathode 300C discussed above with respect to FIGS. 3A-3C.

At operation 540, in some embodiments, an output voltage level of the pixel sensor is generated based on the internal node voltage level. Generating the output voltage level includes receiving the internal node voltage level at a gate of a transistor configured to generate the output voltage. In some embodiments, receiving the internal node voltage level at the gate of the transistor includes receiving the internal node voltage level at the gate of the transistor configured as a source follower, the output voltage level thereby following the internal node voltage level. In some embodiments, receiving the internal node voltage level at the gate of the transistor includes receiving voltage Vn1 at the gate of transistor SF discussed above with respect to FIG. 2.

In some embodiments, generating the output voltage level includes using a selection transistor to selectively couple the transistor to an output node of the pixel sensor. In some embodiments, using the selection transistor to selectively couple the transistor to the output node includes using transistor RS to selective couple transistor SF to output node OUT discussed above with respect to FIG. 2.

In some embodiments, using the selection transistor to selectively couple the transistor to the output node includes receiving a control signal at a gate of the selection transistor. In some embodiments, receiving the control signal at the gate of the selection transistor includes receiving signal Vrs at the gate of transistor RS discussed above with respect to FIG. 2.

In some embodiments, using the selection transistor to selectively couple the transistor to the output node includes using a circuit to generate the control signal provided at the gate of the selection transistor. In some embodiments, using the circuit to generate the control signal includes using peripheral circuit 400P discussed above with respect to FIG. 4.

At operation 550, in some embodiments, the reset transistor is used to couple the internal node to the power supply node after using the transfer transistor to decouple the cathode from the internal node. Using the transfer transistor to decouple the cathode from the internal node includes using the vertical gate structures of the transfer transistor to decouple the cathode from the internal node.

Using the vertical gate structures to decouple the cathode from the internal node includes biasing the vertical gate structures to a common second voltage level different from the common bias voltage level used to couple the cathode to the internal node. Biasing the vertical gate structures to the second voltage level includes reducing or eliminating the conductive channel between the photodiode and the internal node provided in response to the bias voltage level, e.g., conductive channel 100CH discussed above with respect to FIGS. 1A and 1B.

Using the transfer transistor to decouple the cathode from the internal node thereby includes using the vertical gate structures of the transfer transistor in the decoupling operation having features analogous to those of the coupling operation discussed above with respect to operation 530.

Using the reset transistor to couple the internal node to the power supply node is performed as discussed above with respect to operation 510.

By executing some or all of the operations of method 500, electromagnetic radiation is detected using vertical gate structures of a transfer transistor having the properties, and thereby the benefits, discussed above with respect to transistor structure 100, pixel sensor circuit 200, pixel sensors 300 and 300P, and pixel sensor array 400.

Figure 6:
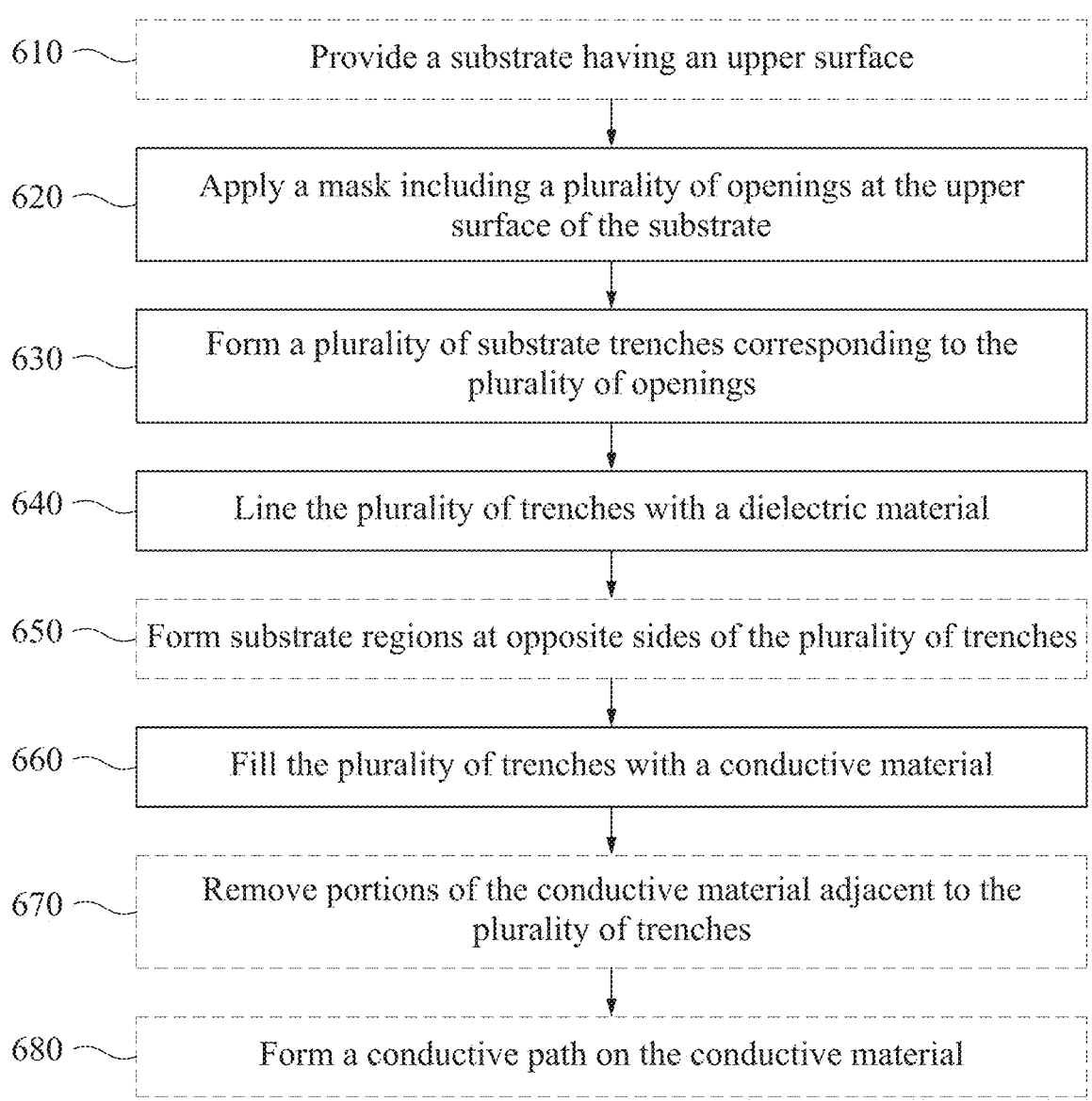
FIG. 6 is a flowchart of a method of manufacturing a transistor structure, in accordance with some embodiments.

FIG. 6 is a flowchart of a method 600 of manufacturing a transistor structure, e.g., transistor structure 100 discussed above with respect to FIGS. 1A and 1B, in accordance with some embodiments. FIGS. 7A-7F are diagrams of transistor structure 100 at various manufacturing stages corresponding to the operations of method 600, in accordance with some embodiments.

Each of FIGS. 7A-7F corresponds to the cross-sectional view of transistor structure 100 depicted in FIG. 1B. To facilitate the illustration of the various features, the cross-sectional views include only relevant portions of transistor structure 100. The arrangement of the features depicted in FIGS. 7A-7F is a non-limiting example provided for the purpose of illustration. In various embodiments, the operations of method 600 correspond to transistor structure 100 having the various features and arrangements discussed above with respect to FIGS. 1A and 1B.

The sequence in which the operations of method 600 are depicted in FIG. 6 is for illustration only; the operations of method 600 are capable of being executed simultaneously or in sequences that differ from that depicted in FIG. 6. In some embodiments, operations in addition to those depicted in FIG. 6 are performed before, between, during, and/or after the operations depicted in FIG. 6.

In various embodiments, some or all of method 600 is executed as part of manufacturing a pixel sensor, e.g., pixel sensor 300 or 300P discussed above with respect to FIGS. 3A-3C, a pixel sensor circuit, e.g., pixel sensor circuit 200 discussed above with respect to FIG. 2, or a pixel sensor array, e.g., pixel sensor array 400 discussed above with respect to FIG. 4.

At operation 610, in some embodiments, a substrate having an upper surface is provided. In various embodiments, providing the substrate includes providing a bulk silicon layer or a SOI substrate, a silicon layer having n-type or p-type doping, or a compound semiconductor material. In some embodiments, providing the substrate includes providing substrate 100B having upper surface 100S discussed above with respect to FIGS. 1A, 1B, and 3A-3C, and discussed below with respect to FIGS. 7A-7F.

In some embodiments, providing the substrate having the upper surface includes providing the upper surface by executing a planarization process, e.g., a chemical-mechanical polishing (CMP).

Figure 7A:
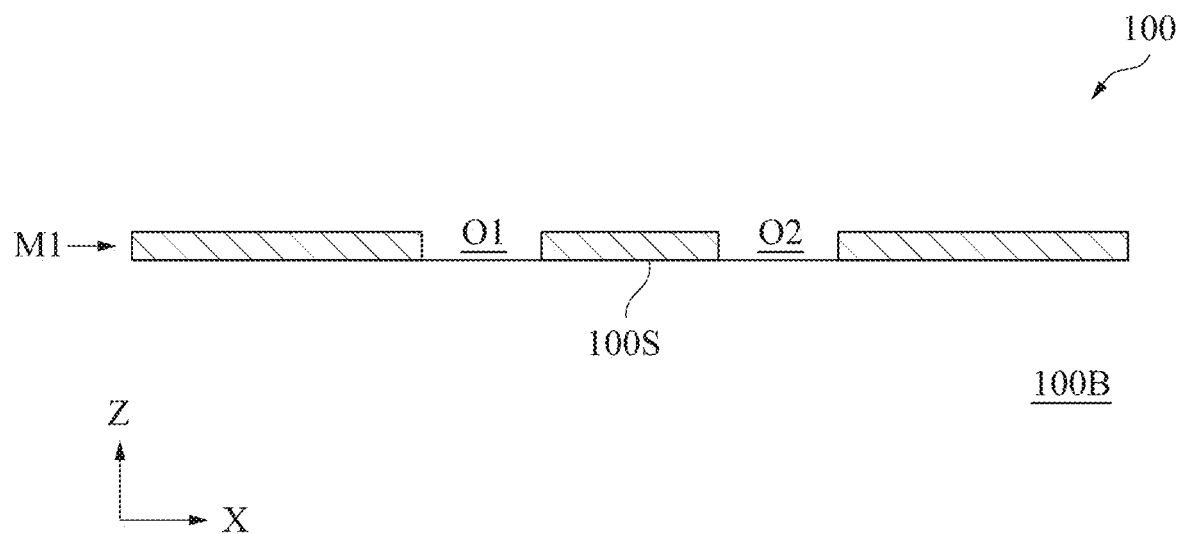
FIGS. 7A-7F are diagrams of a transistor structure at various manufacturing stages, in accordance with some embodiments.

At operation 620, a mask including a plurality of openings is applied at the upper surface of the substrate. In some embodiments, applying the mask includes depositing a photoresist material on the upper surface and using photolithography to form a pattern in the photoresist material corresponding to the plurality of openings and selectively remove the patterned portions of the photoresist material. In some embodiments, applying the mask includes applying mask M1 including plurality of openings O1 and O2 at upper surface 100S, as depicted in FIGS. 7A and 7B.

At operation 630, a plurality of substrate trenches corresponding to the plurality of openings is formed. Forming the plurality of trenches includes forming the plurality of trenches configured in accordance with the conductive protrusions, e.g., conductive protrusions P1-P6, of gate conductor 100G discussed above with respect to FIGS. 1A, 1B, and 3A-3C.

Forming the plurality of trenches includes removing portions of the substrate exposed by the plurality of openings. In some embodiments, forming the plurality of trenches includes performing an etching process. In various embodiments, using an etching process includes using one or more etch processes such as a wet etch, a dry etch, a sputtering etch or other suitable removal process. In various embodiments, using an etching process includes using one or more etchant materials, e.g., one or more of $Cl_2$, $SF_6$, HBr, HCl, $CF_4$, $CHF_3$, $C_2F_6$, $C_4F_8$, or other suitable etchant materials.

Figure 7B:
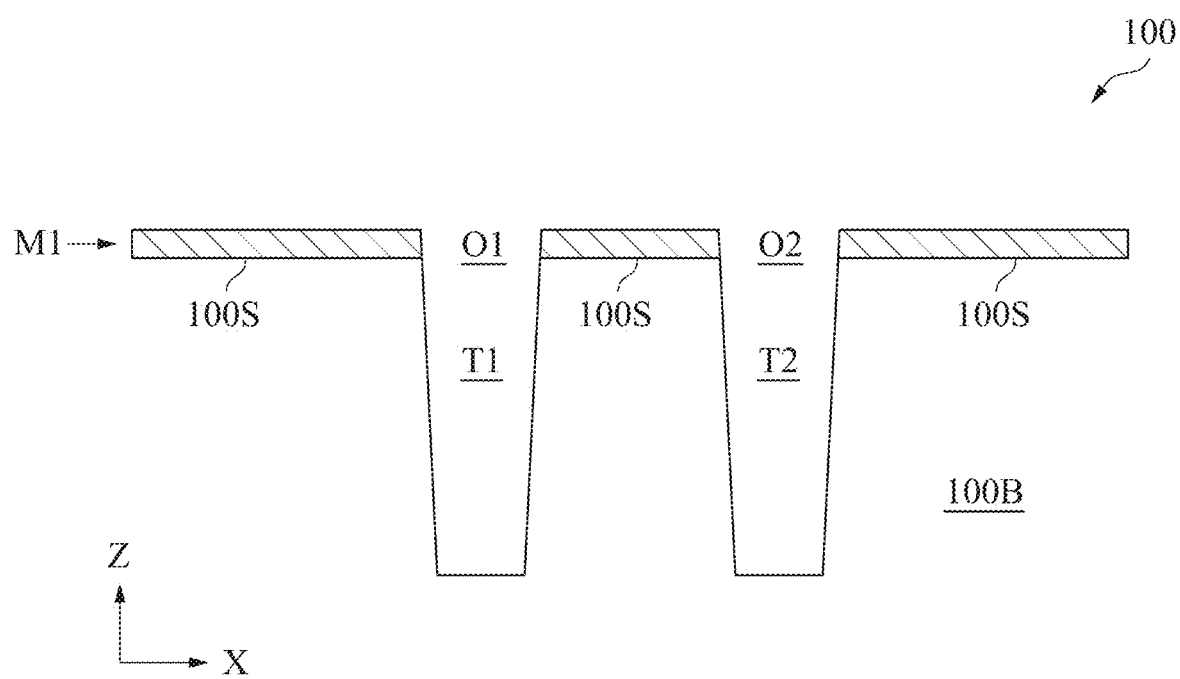
Figure 7C:
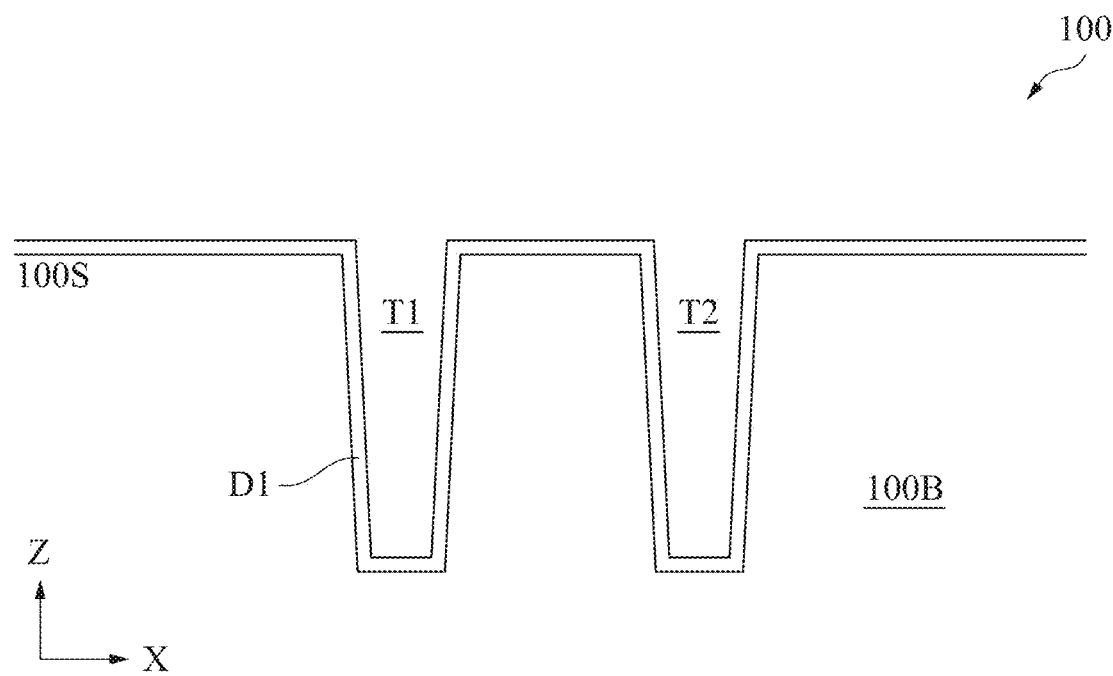
Figure 7D:
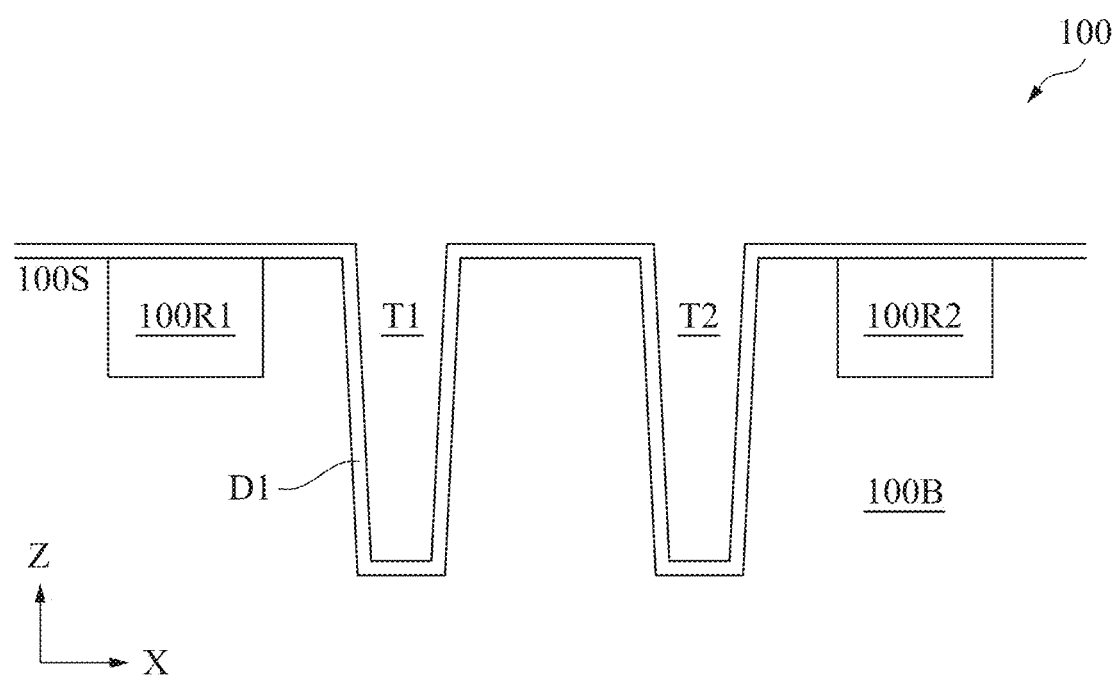

In some embodiments, forming the plurality of trenches corresponding to the plurality of openings includes forming trenches T1 and T2 corresponding to respective openings O1 and O2, as depicted in FIG. 7B.

In some embodiments, forming the plurality of trenches includes removing the mask from the upper surface of the substrate after removing the portions of the substrate exposed by the plurality of openings.

At operation 640, the plurality of trenches is lined with a dielectric material. Lining the plurality of trenches with the dielectric material includes lining an entirety of the surface of each trench of the plurality of trenches with the dielectric material. In some embodiments, lining the plurality of trenches with the dielectric material includes lining one or more portions of the upper surface of the substrate between and/or adjacent to the plurality of trenches with the dielectric material. In some embodiments, lining the plurality of trenches with the dielectric material includes forming a dielectric layer D1 depicted in FIGS. 7C-7E.

In some embodiments, lining the plurality of trenches with the dielectric material includes using a deposition process. In various embodiments, a deposition process includes a chemical vapor deposition (CVD), a plasma enhanced CVD (PECVD), or other process suitable for depositing one or more material layers.

In various embodiments, lining the plurality of trenches with the dielectric material includes depositing one or more of $SiO_2$, silicon nitride, ($Si_3N_4$), aluminum oxide ($Al_2O_3$), hafnium oxide ($HfO_2$), tantalum pentoxide ($Ta_2O_5$), titanium oxide ($TiO_2$), or another suitable material.

At operation 650, in some embodiments, substrate regions are formed at opposite sides of the plurality of trenches. Forming the substrate regions includes forming regions having a doping type opposite that of the substrate. In some embodiments, forming the substrate regions includes forming regions 100R1 and 100R2 discussed above with respect to FIGS. 1A, 1B, and 3A-3C, and depicted in FIGS. 7D-7F.

In various embodiments, forming the substrate regions includes performing an implant and/or deposition process. In some embodiments, forming the substrate regions includes removing portions of the dielectric material, e.g., dielectric layer D1, deposited on the upper surface of the substrate.

In some embodiments, an implant process includes implanting one or more donor dopants, e.g., P or As, and/or one or more acceptor dopants, e.g., B or Al. In some embodiments, performing a deposition process includes depositing one or more of Si or a compound semiconductor, e.g., InP, GaAs, SiGe, InAs, SiC, or another suitable compound semiconductor material. In some embodiments, performing a deposition process includes forming one or more epitaxial layers.

At operation 660, the plurality of trenches is filled with a conductive material. Filling the plurality of trenches with a conductive material includes forming conductive protrusions, e.g., conductive protrusions P1-P6, of gate conductor 100G discussed above with respect to FIGS. 1A, 1B, and 3A-3C. In some embodiments, filling the plurality of trenches with the conductive material includes performing a deposition process.

In various embodiments, filling the plurality of trenches with the conductive material includes filling the plurality of trenches with one or more of polysilicon, Cu, Al, W, Co, Ru, or one or more other metals, and/or one or more other suitable materials.

Figure 7E:
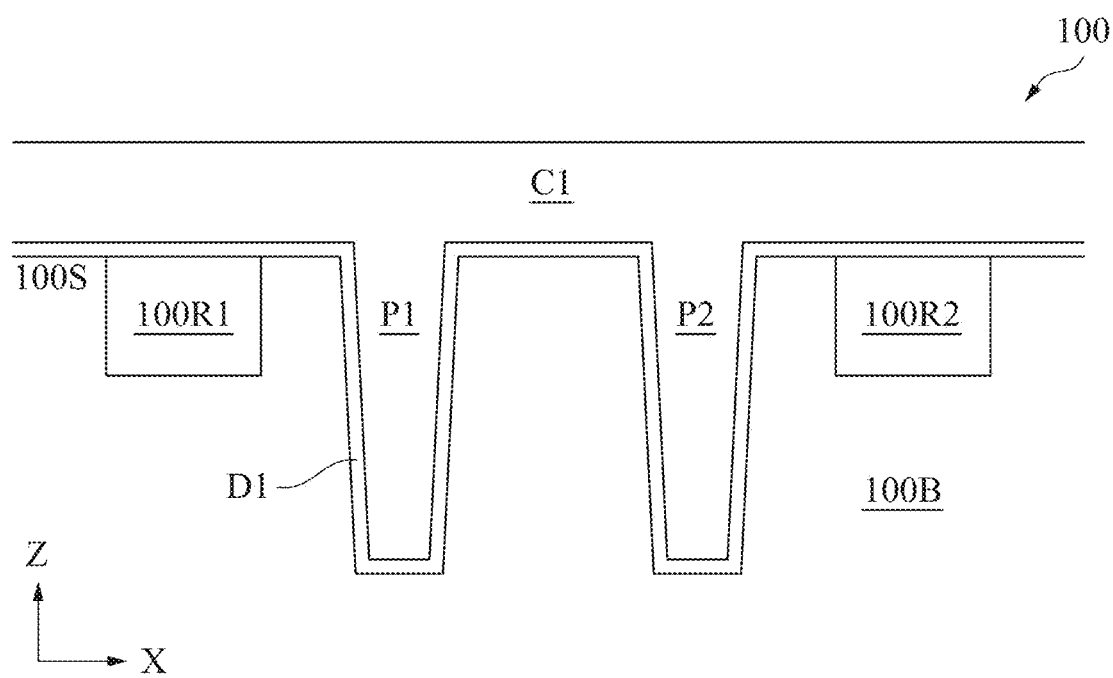

In some embodiments, filling the plurality of trenches with the conductive material includes depositing the conductive material on the dielectric material deposited in the plurality of trenches and on the upper surface of the substrate. In some embodiments, filling the plurality of trenches with the conductive material includes depositing a conductive layer C1 on dielectric layer D1 deposited in trenches T1 and T2 and on upper surface 100S as depicted in FIG. 7E.

At operation 670, in some embodiments, portions of the conductive material adjacent to the plurality of trenches are removed. In various embodiments, removing the portions of the conductive material adjacent to the plurality of trenches includes removing portions of the conductive material adjacent to the plurality of trenches in the positive and/or negative X direction and/or in the positive Z direction.

Figure 7F:
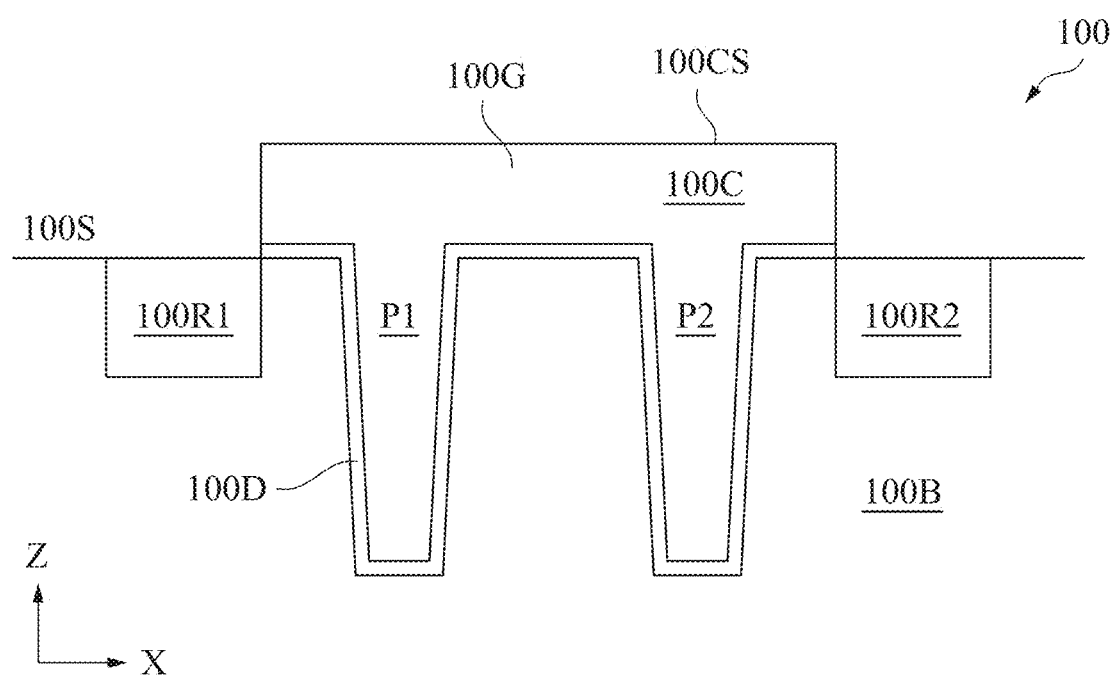

In some embodiments, removing the portions of the conductive material adjacent to the plurality of trenches includes removing portions of conductive layer C1 adjacent to trenches T1 and T2 in the positive and negative X directions to form conductive region 100C of gate conductor 100G, as depicted in FIG. 7F. In some embodiments, removing the portions of the conductive material adjacent to the plurality of trenches includes removing portions of conductive layer C1 adjacent to trenches T1 and T2 in the positive Z direction to form top surface 100CS of conductive region 100C of gate conductor 100G, as depicted in FIG. 7F.

In some embodiments, removing the portions of the conductive material adjacent to the plurality of trenches includes removing portions of the conductive material overlying one or both of the substrate regions, e.g., substrate region 100R1 and 100R2.

In some embodiments, removing the portions of the conductive material adjacent to the plurality of trenches includes removing portions of the dielectric material on the upper surface of the substrate, e.g., portions of dielectric layer D1 on upper surface 100S, as depicted in FIG. 7F.

At operation 680, in some embodiments, a conductive path is formed on the conductive material. Forming the conductive path includes forming a via (not shown) overlying the conductive material, thereby forming an electrical connection between the conductive material and the via.

The operations of method 600 are usable to form an IC structure, e.g., transistor structure 100 discussed above with respect to FIGS. 1A, 1B, and 3A-3C, by forming conductive protrusions of a gate conductor between adjacent substrate regions. Compared to methods that do not include forming the conductive protrusions, method 600 is usable to form transistor structures with improved electron transmission efficiency as discussed above with respect to transistor structure 100.

In some embodiments, a method of manufacturing a transistor structure includes forming a plurality of trenches in a substrate, lining the plurality of trenches with a dielectric material, forming first and second substrate regions at opposite sides of the plurality of trenches, and filling the plurality of trenches with a conductive material. The plurality of trenches includes first and second trenches aligned between the first and second substrate regions, and filling the plurality of trenches with the conductive material includes the conductive material extending continuously between the first and second trenches. In some embodiments, forming the plurality of trenches includes forming each trench of the plurality of trenches having a circular cross-section. In some embodiments, forming the plurality of trenches includes forming the plurality of trenches having a same depth in the substrate. In some embodiments, the substrate has a substrate thickness, and forming the plurality of trenches includes forming each trench of the plurality of trenches having a depth in the substrate ranging from 3% to 90% of the substrate thickness. In some embodiments, forming the plurality of trenches includes forming the first and second trenches having a same diameter and separated by a distance equal to or greater than one half of the same diameter. In some embodiments, forming the first trench includes forming the first trench extending into a cathode of a photodiode. In some embodiments, forming the second trench includes forming the second trench extending into the cathode of the photodiode. In some embodiments, forming the plurality of trenches in the substrate includes forming the plurality of trenches in a SOI substrate. In some embodiments, filling the plurality of trenches with the conductive material includes the conductive material extending continuously between the first and second substrate regions. In some embodiments, forming the second substrate region includes forming a floating diffusion region of a pixel sensor.

In some embodiments, a method of manufacturing a transistor structure includes etching a plurality of trenches at an upper surface of a p-type substrate region, depositing a dielectric material on the plurality of trenches and a portion of the upper surface between each trench of the plurality of trenches, forming n-type source and drain regions at the upper surface, wherein first and second trenches of the plurality of trenches are aligned between the source and drain regions, and depositing a conductive material on the dielectric material in the first and second trenches of the plurality of trenches and on the portion of the upper surface. In some embodiments, forming the n-type drain region includes forming a lightly doped drain. In some embodiments, the plurality of trenches is a first plurality of trenches, the n-type source region is a first n-type source region, the portion of the upper surface is a first portion of the upper surface, and the method includes etching a second plurality of trenches at the upper surface of the p-type substrate region, wherein the drain is between the first and second pluralities of trenches, depositing the dielectric material on the second plurality of trenches and a second portion of the upper surface between each trench of the second plurality of trenches, forming a second n-type source region at the upper surface, wherein first and second trenches of the second plurality of trenches are aligned between the second source region and the drain region, and depositing the conductive material on the dielectric material in the first and second trenches of the second plurality of trenches and on the second portion of the upper surface. In some embodiments, the method includes etching third and fourth pluralities of trenches at the upper surface of the p-type substrate region, wherein the drain is between the third and fourth pluralities of trenches, depositing the dielectric material on the third and fourth pluralities of trenches and corresponding third and fourth portions of the upper surface between each trench of the third and fourth pluralities of trenches, forming third and fourth n-type source regions at the upper surface, wherein first and second trenches of the third plurality of trenches are aligned between the third source region and the drain region, and first and second trenches of the fourth plurality of trenches are aligned between the fourth source region and the drain region, and depositing the conductive material on the dielectric material in the first and second trenches of each of the third and fourth pluralities of trenches and on the third and fourth portions of the upper surface. In some embodiments, each of the etching the plurality of trenches, the depositing the dielectric material, the forming n-type source and drain regions, and the depositing the conductive material is part of forming a transfer gate of a pixel sensor of a pixel sensor array, and the method includes forming corresponding transfer gates of each additional pixel sensor of the pixel sensor array.

In some embodiments, a method of manufacturing a transistor structure includes forming an array of trenches in a substrate, wherein the array comprises first and second columns of trenches, lining each trench of the array and an upper surface of the substrate with a dielectric material, forming a first substrate region adjacent to the first column and a second substrate region adjacent to the second column, and depositing a conductive material on the dielectric material, thereby forming conductive protrusions in each trench of the array and a conductive layer overlying and continuous with each conductive protrusion. In some embodiments, depositing the conductive material on the dielectric material includes forming the conductive layer overlying the first and second substrate regions. In some embodiments, the method includes removing a portion of the conductive layer overlying the first substrate region and a portion of the conductive layer overlying the second substrate region. In some embodiments, forming the conductive protrusions in each trench of the array includes forming each conductive protrusion having approximately a same diameter and separated from each nearest conductive protrusion along a row or column direction by approximately a same distance. In some embodiments, the same distance is equal to or greater than one half of the same diameter.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A method of manufacturing a transistor structure, the method comprising:
   forming a plurality of trenches in a substrate;
   lining the plurality of trenches with a dielectric material;
   forming first and second substrate regions at opposite sides of the plurality of trenches; and
   filling the plurality of trenches with a conductive material, wherein
   the plurality of trenches comprises first and second trenches aligned between the first and second substrate regions,
   the filling the plurality of trenches with the conductive material comprises the conductive material extending continuously between the first and second trenches, and the forming the first substrate region comprises forming a portion of a cathode of a photodiode of a pixel sensor.

2. The method of claim 1, wherein the forming the plurality of trenches comprises forming each trench of the plurality of trenches having a circular cross-section.

3. The method of claim 1, wherein the forming the plurality of trenches comprises forming the plurality of trenches having a same depth in the substrate.

4. The method of claim 1, wherein
the substrate has a substrate thickness, and
the forming the plurality of trenches comprises forming each trench of the plurality of trenches having a depth in the substrate ranging from 3% to 90% of the substrate thickness.

5. The method of claim 1, wherein the forming the plurality of trenches comprises forming the first and second trenches having a same diameter and separated by a distance equal to or greater than one half of the same diameter.

6. The method of claim 1, wherein the forming the first trench comprises forming the first trench extending into the cathode of the photodiode.

7. The method of claim 6, wherein the forming the second trench comprises forming the second trench extending into the cathode of the photodiode.

8. The method of claim 1, wherein the forming the plurality of trenches in the substrate comprises forming the plurality of trenches in a silicon-on-insulator (SOI) substrate.

9. The method of claim 1, wherein the filling the plurality of trenches with the conductive material comprises the conductive material extending continuously between the first and second substrate regions.

10. The method of claim 1, wherein the forming the second substrate region comprises forming a floating diffusion region of the pixel sensor.

11. A method of manufacturing a transistor structure, the method comprising:
etching a plurality of trenches at an upper surface of a p-type substrate region;
depositing a dielectric material on the plurality of trenches and a portion of the upper surface between each trench of the plurality of trenches;
forming n-type source and drain regions at the upper surface, wherein first and second trenches of the plurality of trenches are aligned between the source and drain regions; and
depositing a conductive material on the dielectric material in the first and second trenches of the plurality of trenches and on the portion of the upper surface,
wherein the etching the plurality of trenches comprises etching the trenches separated by a distance equal to or greater than one half of a largest dimension of each trench in a plane corresponding to the upper surface.

12. The method of claim 11, wherein the forming the n-type drain region comprises forming a lightly doped drain.

13. The method of claim 11, wherein
the plurality of trenches is a first plurality of trenches,
the n-type source region is a first n-type source region,
the portion of the upper surface is a first portion of the upper surface, and
the method further comprises:
etching a second plurality of trenches at the upper surface of the p-type substrate region, wherein the drain is between the first and second pluralities of trenches;
depositing the dielectric material on the second plurality of trenches and a second portion of the upper surface between each trench of the second plurality of trenches;
forming a second n-type source region at the upper surface, wherein first and second trenches of the second plurality of trenches are aligned between the second source region and the drain region; and
depositing the conductive material on the dielectric material in the first and second trenches of the second plurality of trenches and on the second portion of the upper surface.

14. The method of claim 13, further comprising:
etching third and fourth pluralities of trenches at the upper surface of the p-type substrate region, wherein the drain is between the third and fourth pluralities of trenches;
depositing the dielectric material on the third and fourth pluralities of trenches and corresponding third and fourth portions of the upper surface between each trench of the third and fourth pluralities of trenches;
forming third and fourth n-type source regions at the upper surface, wherein first and second trenches of the third plurality of trenches are aligned between the third source region and the drain region, and first and second trenches of the fourth plurality of trenches are aligned between the fourth source region and the drain region; and
depositing the conductive material on the dielectric material in the first and second trenches of each of the third and fourth pluralities of trenches and on the third and fourth portions of the upper surface.

15. The method of claim 11, wherein
each of the etching the plurality of trenches, the depositing the dielectric material, the forming n-type source and drain regions, and the depositing the conductive material is part of forming a transfer gate of a pixel sensor of a pixel sensor array, and
the method further comprises forming corresponding transfer gates of each additional pixel sensor of the pixel sensor array.

16. A method of manufacturing a transistor structure, the method comprising:
forming an array of trenches in a substrate, wherein the array comprises first and second columns of trenches;
lining each trench of the array and an upper surface of the substrate with a dielectric material;
forming a photodiode of a pixel sensor comprising a first substrate region adjacent to the first column and a floating diffusion region of the pixel sensor comprising a second substrate region adjacent to the second column; and
depositing a conductive material on the dielectric material, thereby forming conductive protrusions in each trench of the array and a conductive layer overlying and continuous with each conductive protrusion.

17. The method of claim 16, wherein the depositing the conductive material on the dielectric material comprises forming the conductive layer overlying the first and second substrate regions.

18. The method of claim 17, further comprising removing a portion of the conductive layer overlying the first substrate region and a portion of the conductive layer overlying the second substrate region.

19. The method of claim 16, wherein the forming the conductive protrusions in each trench of the array comprises forming each conductive protrusion having approximately a same diameter and separated from each nearest conductive protrusion along a row or column direction by approximately a same distance.

20. The method of claim 19, wherein the same distance is equal to or greater than one half of the same diameter.

\* \* \* \* \*